US009172926B2

(12) United States Patent
Aoki et al.

(10) Patent No.: US 9,172,926 B2
(45) Date of Patent: Oct. 27, 2015

(54) IMAGING DEVICE, AND IMAGE PROCESSING METHOD

(71) Applicant: FUJIFILM Corporation, Tokyo (JP)

(72) Inventors: Takashi Aoki, Saitama (JP); Yoichi Iwasaki, Saitama (JP); Hiroshi Endo, Saitama (JP); Kenkichi Hayashi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/589,478

(22) Filed: Jan. 5, 2015

(65) Prior Publication Data

US 2015/0117832 A1 Apr. 30, 2015

Related U.S. Application Data

(63) Continuation of application No. PCT/JP2012/084087, filed on Dec. 28, 2012.

(30) Foreign Application Priority Data

Jul. 6, 2012 (JP) ................................. 2012-152816

(51) Int. Cl.
*H04N 5/243* (2006.01)
*G02B 7/28* (2006.01)
(Continued)

(52) U.S. Cl.
CPC ........... *H04N 9/077* (2013.01); *H04N 5/23212* (2013.01); *H04N 5/345* (2013.01);
(Continued)

(58) Field of Classification Search
CPC ....... H04N 5/23212; H04N 5/243; G02B 7/28

USPC .......................... 348/345, 349, 351, 272, 273
See application file for complete search history.

(56) References Cited

U.S. PATENT DOCUMENTS 5,889,554 A 3/1999 Mutze
2009/0200451 A1 8/2009 Conners
(Continued)

FOREIGN PATENT DOCUMENTS

EP 1793620 A1 6/2007
JP 2-210996 A 8/1990
(Continued)

OTHER PUBLICATIONS

International Preliminary Report on Patentability, issued in PCT/JP2012/084087, dated Dec. 6, 2013.
(Continued)

*Primary Examiner* — Tuan Ho
(74) *Attorney, Agent, or Firm* — Birch, Stewart, Kolasch & Birch, LLP

(57) ABSTRACT

One aspect of the present invention thinning-reads pixel signals from the multiple pixels according to a thinning pattern from an image pickup element, or extracts pixel signals from the multiple pixels according to the thinning pattern from a color image that is read from the image pickup element and corresponds to the color filter array, and acquires a thinned color image. Then, moving image data is generated on the basis of the thinned color image. Adoption of the thinned color image as a target image to be subjected to moving image processing can facilitate reduction in processing time per frame, and prevent the frame rate from decreasing. Furthermore, thinning-reading pixels from the image pickup element can facilitate reduction in time of reading an image from the image pickup element.

21 Claims, 21 Drawing Sheets

(51) Int. Cl.
H04N 9/077 (2006.01)
H04N 5/345 (2011.01)
H04N 5/232 (2006.01)
H04N 5/369 (2011.01)
H04N 9/04 (2006.01)
H04N 5/374 (2011.01)
H04N 9/64 (2006.01)
H04N 9/80 (2006.01)
H04N 5/77 (2006.01)
H04N 9/804 (2006.01)
H01L 27/146 (2006.01)

(52) U.S. Cl.
CPC .......... *H04N 5/3456* (2013.01); *H04N 5/3696* (2013.01); *H04N 5/3742* (2013.01); *H04N 5/772* (2013.01); *H04N 9/045* (2013.01); *H04N 9/64* (2013.01); *H04N 9/80* (2013.01); *H04N 9/8042* (2013.01); *H01L 27/14627* (2013.01); *H04N 2209/046* (2013.01)

(56) References Cited

U.S. PATENT DOCUMENTS

| | | |
|---|---|---|
| 2011/0267533 A1 | 11/2011 | Hirose |
| 2012/0033115 A1 | 2/2012 | Fujii |
| 2014/0168480 A1* | 6/2014 | Okazawa et al. ............. 348/241 |
| 2015/0103210 A1* | 4/2015 | Inoue ............................ 348/239 |

FOREIGN PATENT DOCUMENTS

| | | |
|---|---|---|
| JP | 2009-89144 A | 4/2009 |
| JP | 2010-181751 A | 8/2010 |
| JP | 2010-258110 A | 11/2010 |
| JP | 2012-32723 A | 2/2012 |

OTHER PUBLICATIONS

International Search Report, issued in PCT/JP2012/084087, dated Apr. 9, 2013.
Written Opinion of the International Searching Authority, issued in PCT/JP2012/084087, dated Apr. 9, 2013.
Extended European Search Report dated Aug. 4, 2014, for European Application No. 11859479.5.
Extended European Search Report dated Jan. 27, 2015, for European Application No. 12804973.1.
Extended European Search Report dated Oct. 28, 2014, for European Application No. 11859950.5 1.
Hirakawa et al., "Spatio-Spectral Color Filter Array Design for Optimal Image Recovery", IEEE Transactions on Image Processing, vol. 17, No. 10, Oct. 2008, pp. 1876-1890.

* cited by examiner

FIG.8
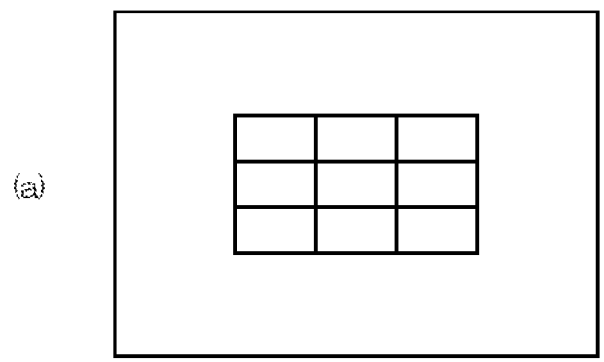
(a)
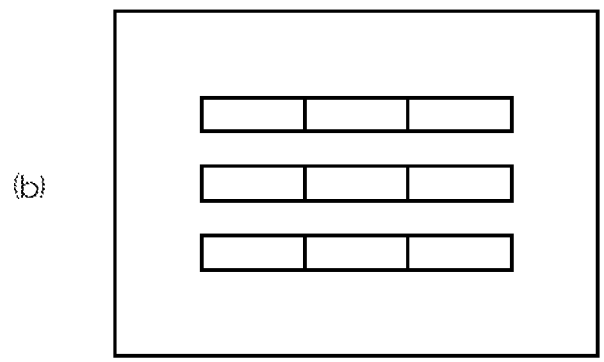
(b)
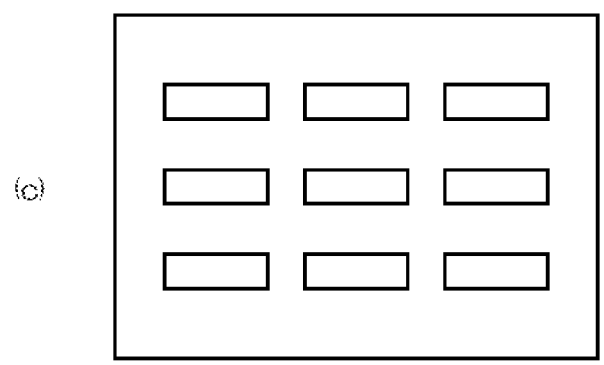
(c)

IMAGING DEVICE, AND IMAGE PROCESSING METHOD

CROSS-REFERENCE TO RELATED APPLICATIONS

This application is a Continuation of PCT International Application No. PCT/JP2012/084087 filed on Dec. 28, 2012, which claims priority under 35 U.S.C. §119(a) to Japanese Patent Application No. 2012-152816 filed on Jul. 6, 2012. Each of the above application(s) is hereby expressly incorporated by reference, in its entirety, into the present application.

BACKGROUND OF THE INVENTION

1. Field of the Invention

The present invention relates to an imaging device and an image processing method and, in particular, to an imaging device and an image processing method that perform moving image generation and focus adjustment based on phase difference in parallel.

2. Description of the Related Art

Conventionally, automatic focus adjustment (phase difference AF) has been known where first and second phase difference pixels on which a subject image having passed through left and right regions of an imaging lens is pupil-divided and image-formed are provided in a part of an image pickup element, the phase difference between output signals of the first and second phase difference pixels are detected, and the focus position of a focusing lens is adjusted on the basis of the detected phase difference.

An image pickup element described in PTL 1 (Japanese Patent Application Laid-Open No. 2009-89144) includes a typical Bayer array color filter. In the horizontal direction and the vertical direction, first pixels for detecting the focal position (pixels on the left side of pupil division) and second pixels for detecting the focal position (pixels on the right side of pupil division) are alternately arranged at a predetermined period (at a period of six pixels in the horizontal direction, and at a period of three pixels in the vertical direction). The first and second pixels for detecting the focal position are arranged on pixel positions where green (G) filters are arranged.

In the case of detecting the focal point, an electronic camera described in PTL 1 thinning-reads an image on lines (line image) where the first and second pixels for detecting the focal point are arranged, detects the focus position on the basis of the image signal of the first and second pixels for detecting the focal point in the thinning-read line image, and controls the position of the focusing lens, while performing live view display in real time on the basis of the image signal of the thinning-read line image (including the first and second pixels for detecting the focal point). In the case of not detecting the focal point, a line image where the first and second pixels for detecting the focal point are not arranged is read, and live view display is performed on the basis of the image signal of the line image.

In the case of detecting the focal point, the electronic camera described in PTL 1 pairs the first or second pixels for detecting the focal point (G pixels) and red pixels (R pixels) or blue pixels (B pixels) that are adjacent to the G pixels with each other and extracts signals from the thinning-read line image, and performs live view display on the basis of the image signal of the extracted pixels. Accordingly, image signals of typical G pixels (G pixels other than the first or second pixels for detecting the focal point) are not used for live view display in the case of detecting the focal point.

SUMMARY OF THE INVENTION

The invention described in PTL 1 detects the focal point, and, for live view display, uses the thinning-read first or second pixels for detecting the focal point as G pixels. However, the pixels for detecting the focal point have structures different from the structures of typical pixels. Accordingly, it is inappropriate to use the pixels themselves for detecting the focal point as G pixels.

Furthermore, the array of color filters of the image pickup element described in PTL 1 is a Bayer array. Accordingly, the thinning-read image also conforms to a Bayer array. Therefore, even if the image signal of the pixels for detecting the focal point is acquired by interpolation with adjacent image signals having the same color, vertically and horizontally adjacent pixels are not pixels having the same color, thereby causing a problem in that false colors and the like due to interpolation tend to occur.

The present invention is made in view of such a situation. It is an object of the present invention to provide an imaging device and an image processing method that can accurately perform phase difference AF during taking a moving image including live view display, and prevent or alleviate reduction in quality of a taken image due to phase difference pixels.

In order to achieve the foregoing object, an imaging device according to an aspect of the present invention includes: an imaging lens; an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed; a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating device which generates moving image data, based on the thinned color image; a phase difference detection device which detects a phase difference between output signals that correspond to the first and second phase difference pixels included in the thinned color image, based on each output signal; and a focus adjustment device which adjusts a focus position of the imaging lens based on the phase difference detected by the phase difference detection device, wherein the prescribed color filter array includes first filters corresponding to at least one first color, and second filters corresponding to at least two second colors having lower contribution ratios for acquiring luminance signals than the first color has, and has a basic array pattern according to which the first filters and the second filters are arranged, the basic array pattern being repeatedly arranged in the first direction and the second direction, at least one of each of the first filters and the second filters corresponding to the respective second colors is arranged on each of pixel lines in the first direction and the second direction in the basic array pattern, and the first and second phase difference pixels are arranged at positions of the filters having the same color on pixel lines in the first direction, on the thinning pattern in the focal point detection area of the image pickup element.

The one aspect of the present invention thinning-reads pixel signals according to a thinning pattern from the image pickup element, or extracts pixel signals according to the thinning pattern from a color image that is read from the image pickup element and corresponds to the prescribed color filter array, and acquires a thinned color image. Then, moving image data is generated on the basis of the thinned color image. Adoption of the thinned color image as a target image to be subjected to moving image processing can facilitate reduction in processing time per frame, and prevent the frame rate from decreasing. Furthermore, thinning-reading pixels from the image pickup element can facilitate reduction in time of reading an image from the image pickup element.

At least in the focal point detection area in the acquired color image having the color array, the first and second phase difference pixels are arranged at the positions of filters having the same color on the pixel line in the first direction on the thinning pattern. Accordingly, the first and second phase difference pixels can be acquired in two dimensions that are in the first direction and the second direction, and the phase differences of the output signals corresponding to the first and second phase difference pixels can be accurately detected on the basis of the output signals.

Furthermore, at least one of each of first filters and second filters corresponding to respective colors of second colors is arranged on each pixel line in the first direction and the second direction in the basic array patterns. Accordingly, in the case of taking an image (e.g., a still image taking) using the entire pixels without thinning, occurrence of false color in the taken image (still image etc.) can be reduced and high resolution can be achieved. Moreover, the normal pixels (pixels other than the first and second phase difference pixels) can be arranged as pixels around the first and second phase difference pixels. Accordingly, the pixel values of the color pixels at the positions of the first and second phase difference pixels can be accurately acquired when the values are generated by interpolation with the pixel values of the surrounding pixels including adjacent pixels.

According to the foregoing configuration, the imaging device of this aspect can accurately perform phase difference AF during moving image taking, and prevent or alleviate reduction in image quality of the image taken through the phase difference pixels.

The imaging device according to an another aspect of the present invention relates to an imaging device, including: an imaging lens; an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed; a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating device which generates moving image data, based on the thinned color image; a phase difference detection device which detects a phase difference between output signals that correspond to the first and second phase difference pixels included in the thinned color image, based on each output signal; and a focus adjustment device which adjusts a focus position of the imaging lens based on the phase difference detected by the phase difference detection device, wherein the prescribed color filter array includes first filters corresponding to at least one first color having a peak of transmittance within a wavelength range from 480 nm to 570 nm, and second filters corresponding to at least two second colors having peaks of transmittance out of this range, and has a basic array pattern according to which the first filters and the second filters are arranged, the basic array pattern being repeatedly arranged in the first direction and the second direction, and at least one of each of the first filters and the second filters corresponding to the respective second colors is arranged on each of pixel lines in the first direction and the second direction in the basic array pattern, and the first and second phase difference pixels are arranged at positions of the filters having the same color on pixel lines in the first direction, on the thinning pattern in the focal point detection area of the image pickup element.

Another aspect of the present invention is different from the foregoing aspect of the present invention in that the first filters corresponding to the first color are discriminated from the second filters corresponding to the second colors according to whether the peak of transmittance of each filter is within a wavelength range from 480 nm to 570 nm or not. As with the foregoing aspect, the imaging device of this aspect can also accurately perform phase difference AF during moving image taking, and prevent or alleviate reduction in image quality of the taken image due to phase difference pixels.

The imaging device according to an another aspect of the present invention relates to an imaging device, including: an imaging lens; an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed; a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating device which generates moving image data, based on the thinned color image; a phase difference detection device which detects a phase difference between output signals that correspond to the first and second phase difference pixels included in the thinned color image, based on each output signal; and a focus adjustment device which adjusts a focus position of the imaging lens based on the phase difference detected by the phase difference detection device, wherein the prescribed color filter array includes first filters corresponding to at least one first color, and second filters corresponding to at least two second colors having lower transmittances than the first filters within a wavelength range from 500 nm to 560 nm, and has a basic array pattern according to which the first filters and the second filters are arranged, the basic array pattern being repeatedly arranged in the first direction and the second direction, and at least one of each of the first filters and the second filters corresponding to the respective second colors is arranged on each of pixel lines in the first direction and the second direction in the basic array pattern, and the first and second phase difference pixels are arranged at positions of the filters having the same color on pixel lines in the first direction, on the thinning pattern in the focal point detection area of the image pickup element.

Another aspect of the present invention is different from the foregoing aspect of the present invention in that the first filters corresponding to the first color are discriminated from the second filters corresponding to the second colors according to whether the transmittance of each filter at wavelengths ranging from 500 nm to 560 nm is higher or lower. As with the foregoing aspect, the imaging device of this aspect can also accurately perform phase difference AF during moving image taking, and prevent or alleviate reduction in image quality of the taken image due to phase difference pixels.

The imaging device according to an another aspect of the present invention relates to an imaging device, including: an imaging lens; an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed; a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating device which generates moving image data, based on the thinned color image; a phase difference detection device which detects a phase difference between output signals that correspond to the first and second phase difference pixels included in the thinned color image, based on each output signal; and a focus adjustment device which adjusts a focus position of the imaging lens based on the phase difference detected by the phase difference detection device, wherein the prescribed color filter array includes first filters corresponding to at least two first colors that include a color most contributing to luminance signals among three primary colors and a fourth color different from the three primary colors, and second filters corresponding to at least two second colors other than the first colors, and has a basic array pattern according to which the first filters and the second filters are arranged, the basic array pattern being repeatedly arranged in the first direction and the second direction, and at least one of each of the first filters and the second filters corresponding to the respective second colors is arranged on each of pixel lines in the first direction and the second direction in the basic array pattern, and the first and second phase difference pixels are arranged at positions of the filters having the same color on pixel lines in the first direction, on the thinning pattern in the focal point detection area of the image pickup element.

Another aspect of the present invention is different from the foregoing aspect of the present invention in that the first filters correspond to first colors that are at least two colors including a color most contributing to a luminance signal among three primary colors and a fourth color different from the three primary colors, the second filters correspond to second colors that are at least two colors other than the first colors, and the first filters are thus discriminated from the second filters. As with the foregoing aspect, the imaging device of this aspect can also accurately perform phase difference AF during moving image taking, and prevent or alleviate reduction in image quality of the taken image due to phase difference pixels.

Preferably, in the imaging device according to another aspect of the present invention, in the thinned color image, pixels having a color identical to a color of pixels at positions of the first and second phase difference pixels are arranged adjacent to the first and second phase difference pixels, the device further includes an interpolating calculation device which calculates pixel values of the pixels at the positions of the first and second phase difference pixels in the thinned color image by interpolation with pixel values of surrounding pixels including pixels having a same color adjacent to the first and the second phase difference pixels, and the moving image generating device generates the moving image data based on a color image using values calculated by the interpolating calculation device as pixel values of pixels at positions of the first and second phase difference pixels in the thinned color image. In the thinned color image, pixels that have the color identical to the color of the pixels at the positions of the first and second phase difference pixels and are adjacent to the first and second phase difference pixels. Accordingly, for interpolation calculation for the pixel values of the pixels at the positions of the first and second phase difference pixels through use of the pixel values of the pixels having the same color among surrounding pixels, pixels adjacent to the first and second phase difference pixels can be used as surrounding pixels. Therefore, the pixel values of the pixels at the first and second phase difference pixels can be accurately calculated.

Preferably, in the imaging device according to another aspect of the present invention, in the tinned color image, the pixels having the first color are arranged in the second direction, and the pixels having the colors of the second colors are arranged in the second direction. Accordingly, the resolution of the pixels having the first colors in the thinned color image in the second direction can be improved.

Preferably, in the imaging device according to another aspect of the present invention, in the tinned color image, the pixels having the first color are arranged in the second direction, and the pixels having the colors of the second colors are alternately arranged in the second direction. Accordingly, the resolution of the pixels of the first and second colors in the thinned color image in the second direction can be improved, while the accuracy of simultaneous processing can be improved.

Preferably, in the imaging device according to another aspect of the present invention, a ratio of the number of all pixels having the first color corresponding to the first filters is greater than ratios of the numbers of pixels of the respective second colors corresponding to the second filters, and the first and second phase difference pixels are arranged at positions of the first filters.

By arranging the first and second phase difference pixels at the filters (first filters) having a color with a large number of pixels, the pixel values of the pixels at the positions of the first and second phase difference pixels can be accurately calculated on the basis of the pixel values of the pixels of the surrounding first filters.

Preferably, in the imaging device according to another aspect of the present invention, the first filters are arranged in M×N pixels (M, N: integers equal to or greater than three), and the M×N pixels are repeatedly arranged in the first and second directions.

Preferably, in the imaging device according to another aspect of the present invention, one or two phase difference pixels that are one of the first and second phase difference pixels are arranged in M×N pixels. Accordingly, the phase difference pixels can be arranged in a dispersed manner.

Preferably, in the imaging device according to another aspect of the present invention, the first and the second phase difference pixels are arranged such that the first and second phase difference pixels are arranged as a pair in the second direction. Accordingly, the phase difference of the output signals of the first and second phase difference pixels can be detected at the minimum pixel interval in the second direction. Here, the pixel interval is an interval (pitch) of pixels from the center point of the reference pixel to the center point of an adjacent pixel.

Preferably, in the imaging device according to another aspect of the present invention, the first and second phase difference pixels are alternately arranged on one pixel line in the first direction.

Preferably, in the imaging device according to another aspect of the present invention, the second colors are two colors that are a first component color and a second component color, the basic array pattern is configured such that a first sub-array and a second sub-array are alternately arranged in the first direction and the second direction, in the first sub-array and the second sub-array, the second filters are arranged at same positions, and positions of the second filters corresponding to the first component color in the first sub-array correspond to positions of the second filters corresponding to the second component color in the second sub-array, and positions of the second filters corresponding to the second component color in the first sub-array correspond to positions of the second filters corresponding to the first component color in the second sub-array.

Preferably, in the imaging device according to another aspect of the present invention, the first and the second phase difference pixels are arranged at the positions of the first filters in at least one sub-array of the first sub-array and the second sub-array.

Preferably, in the imaging device according to another aspect of the present invention, in at least one direction between the first direction and the second direction, the first or the second phase difference pixel is arranged at a period of a pixel size of each of sub-arrays that are the first sub-array and the second sub-array.

Preferably, in the imaging device according to another aspect of the present invention, the first color is a green (G) color, and the second colors are a red (R) color and a blue (B) color, the color filters include R filters, G filters and B filters corresponding to the R, G and B colors, respectively, the basic array pattern is configured such that a first sub-array and a second sub-array are alternately arranged in the first direction and the second direction, in the first sub-array, the G filters are arranged at a center and four corners of 3×3 pixels, and the B filters are arranged upper and lower and the R filters are arranged left and right, sandwiching the G filter at the center, in the second sub-array, the G filters are arranged at a center and four corners of 3×3 pixels, and the R filters are arranged upper and lower and the B filters are arranged left and right, sandwiching the G filter at the center, and one pixel of the pixels having the G filters in the first and second sub-arrays is configured as one phase difference pixel between the first and second phase difference pixels.

Preferably, in the imaging device according to another aspect of the present invention, the first color is a green (G) color, the second colors are a red (R) color and a blue (B) color, the color filters include R filters, G filters and B filters corresponding to the R, G and B colors, respectively, the basic array pattern is configured such that a first sub-array and a second sub-array are alternately arranged in the first direction and the second direction, in the first array, the R filter is arranged at a center of 3×3 pixels, the B filters are arranged at four corners, and the G filters are arranged upper, lower, left and right, sandwiching the R filter at the center, in the second sub-array, the B filter is arranged at a center of 3×3 pixels, the R filters are arranged at four corners, and the G filters are arranged upper, lower, left and right, sandwiching the B filter at the center, and one pixel of the pixels having the G filters in the first and second sub-arrays is configured as one phase difference pixel between the first and second phase difference pixels.

Preferably, in the imaging device according to another aspect of the present invention, pixels having transparent filters are used instead of the pixels that are configured as the first and second phase difference pixels and have the G filters.

Preferably, in the imaging device according to another aspect of the present invention, the device further includes a recording device which records the moving image generated by the moving image generating device.

Another aspect of the present invention relates to an image processing method in an imaging device comprising an imaging lens, and an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed, the method including: a color image acquisition step of thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating step of generating moving image data, based on the thinned color image; a phase difference detection step of detecting a phase difference between output signals that correspond to the first and second phase difference pixels included in the thinned color image, based on each output signal; and a focus adjustment step of adjusting a focus position of the imaging lens based on the phase difference detected by the phase difference detection step, and adjusting the focus position of the imaging lens in parallel with generation of the moving image by the moving image generating step, wherein the prescribed color filter array includes first filters corresponding to at least one first color, second filters corresponding to at least two second colors having lower contribution ratios for acquiring luminance signals than the first color has, and has a basic array pattern according to which the first filters and the second filters are arranged, the basic array pattern being repeatedly arranged in the first direction and the second direction, and at least one of each of the first filters and the second filters corresponding to the respective second colors is arranged on each of pixel lines in the first direction and the second direction in the basic array pattern, and the first and second phase difference pixels are arranged at positions of the filters having the same color on pixel lines in the first direction, on the thinning pattern in the focal point detection area of the image pickup element.

As with the foregoing imaging device, the imaging processing method of this aspect can also accurately perform phase difference AF during moving image taking, and prevent or alleviate reduction in image quality of the taken image due to phase difference pixels.

Another aspect of the present invention relates to an image processing method in an imaging device including an imaging lens, and an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed, the method including: a color image acquisition step of thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating step of generating moving image data, based on the thinned color image; a phase difference detection step of detecting a phase difference between output signals that correspond to the first and second phase difference pixels included in the thinned color image, based on each output signal; and a focus adjustment step of adjusting a focus position of the imaging lens based on the phase difference detected by the phase difference detection step, and adjusting the focus position of the imaging lens in parallel with generation of the moving image by the moving image generating step, wherein the prescribed color filter array includes first filters corresponding to at least one first color having a peak of transmittance within a wavelength range from 480 nm to 570 nm, and second filters corresponding to at least two second colors having peaks of transmittance out of this range, and has a basic array pattern according to which the first filters and the second filters are arranged, the basic array pattern being repeatedly arranged in the first direction and the second direction, and at least one of each of the first filters and the second filters corresponding to the respective second colors is arranged on each of pixel lines in the first direction and the second direction in the basic array pattern, and the first and second phase difference pixels are arranged at positions of the filters having the same color on pixel lines in the first direction, on the thinning pattern in the focal point detection area of the image pickup element.

As with the foregoing image processing method, the image processing method of this aspect can also accurately perform phase difference AF during moving image taking, and prevent or alleviate reduction in image quality of the taken image due to phase difference pixels.

Another aspect of the present invention relates to an image processing method in an imaging device including an imaging lens, and an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed, the method including: a color image acquisition step of thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating step of generating moving image data, based on the thinned color image; a phase difference detection step of detecting a phase difference between output signals that correspond to the first and second phase difference pixels included in the thinned color image, based on each output signal; and a focus adjustment step of adjusting a focus position of the imaging lens based on the phase difference detected by the phase difference detection step, and adjusting the focus position of the imaging lens in parallel with generation of the moving image by the moving image generating step, wherein the prescribed color filter array includes first filters corresponding to at least one first color, and second filters corresponding to at least two second colors having lower transmittances than the first filters within a wavelength range from 500 nm to 560 nm, and has a basic array pattern according to which the first filters and the second filters are arranged, the basic array pattern being repeatedly arranged in the first direction and the second direction, and at least one of each of the first filters and the second filters corresponding to the respective second colors is arranged on each of pixel lines in the first direction and the second direction in the basic array pattern, and the first and second phase difference pixels are arranged at positions of the filters having the same color on pixel lines in the first direction, on the thinning pattern in the focal point detection area of the image pickup element.

As with the foregoing image processing method, the image processing method of this aspect can also accurately perform phase difference AF during moving image taking, and prevent or alleviate reduction in image quality of the taken image due to phase difference pixels.

Another aspect of the present invention relates to an image processing method in an imaging device including an imaging lens, and an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed, the method including: a color image acquisition step of thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating step of generating moving image data, based on the thinned color image; a phase difference detection step of detecting a phase difference between output signals that correspond to the first and second phase difference pixels included in the thinned color image, based on each output signal; and a focus adjustment step of adjusting a focus position of the imaging lens based on the phase difference detected by the phase difference detection step, and adjusting the focus position of the imaging lens in parallel with generation of the moving image by the moving image generating step, wherein the prescribed color filter array includes first filters corresponding to at least two first colors that include a color most contributing to luminance signals among three primary colors and a fourth color different from the three primary colors, and second filters corresponding to at least two second colors other than the first colors, and has a basic array pattern according to which the first filters and the second filters are arranged, the basic array pattern being repeatedly arranged in the first direction and the second direction, and at least one of each of the first filters and the second filters corresponding to the respective second colors is arranged on each of pixel lines in the first direction and the second direction in the basic array pattern, and the first and second phase difference pixels are arranged at positions of the filters having the same color on pixel lines in the first direction, on the thinning pattern in the focal point detection area of the image pickup element.

As with the foregoing image processing method, the image processing method of this aspect can also accurately perform phase difference AF during moving image taking, and prevent or alleviate reduction in image quality of the taken image due to phase difference pixels.

According to the present invention, the first and second phase difference pixels are arranged on the pixel lines in the first direction in the color image that is thinned during imaging of a moving image including that for live view display. Therefore, even during moving image taking, phase difference AF can be accurately performed. Furthermore, the pixel values at the pixel positions of the first and second phase difference pixels in the thinned color image can be accurately acquired on the basis of the pixel values of the surrounding pixels. Accordingly, reduction in the image quality of the taken image (still image or moving image) due to the phase difference pixels can be prevented or alleviated.

BRIEF DESCRIPTION OF THE DRAWINGS

FIG. 8 is diagrams showing other embodiments of AF areas.

FIG. 10 is a schematic diagram showing a first array example of phase difference pixels in the image pickup element and thinning-reading of image data from the image pickup element.

FIG. 11 is a schematic diagram showing a second array example of phase difference pixels in the image pickup element and thinning-reading of image data from the image pickup element.

FIG. 12 is a schematic diagram showing a third array example of phase difference pixels in the image pickup element and thinning-reading of image data from the image pickup element.

FIG. 14 is a schematic diagram showing a fifth array example of phase difference pixels in the image pickup element and thinning-reading of image data from the image pickup element.

FIG. 16 is a diagram showing a seventh array example of phase difference pixels in the image pickup element and a variation example thereof.

FIG. 17 is a schematic diagram showing an array example of phase difference pixels in the image pickup element having a color filter array of another embodiment and a state of thinning-reading image data from the image pickup element.

FIG. 17 is a schematic diagram showing another array example of phase difference pixels in the image pickup element shown in FIG. 17 and a state of thinning-reading of image data from the image pickup element.

FIG. 19 is a diagram using for illustrating another embodiment of thinning-reading.

FIG. 20 is a diagram using for illustrating a variation example of thinning-reading shown in FIG. 19.

DETAILED DESCRIPTION OF THE EMBODIMENTS

Hereinafter, preferable embodiments of an imaging device and an image processing method according to the present invention are described in detail with reference to the accompanying drawings.

[Imaging Device]

Figure 1:
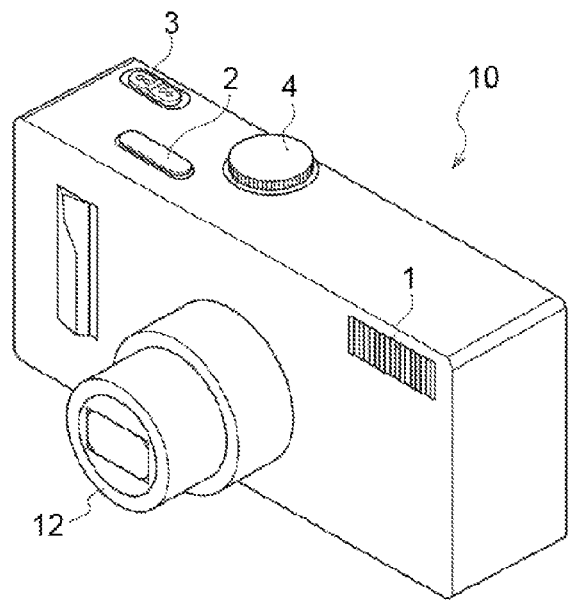
FIG. 1 is a perspective view showing another embodiment of an imaging device according to the present invention.
Figure 2:
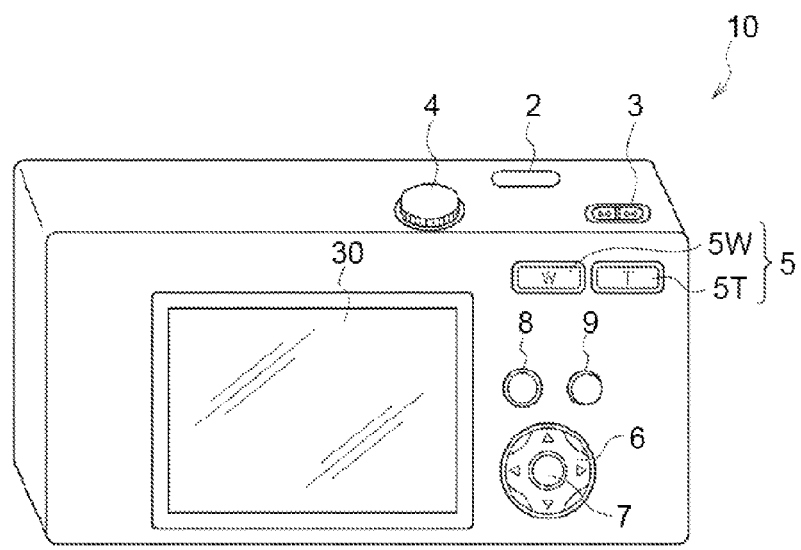
FIG. 2 is a rear view of the imaging device shown in FIG. 1.

FIG. 1 and FIG. 2 are a perspective view and a rear view, respectively, showing an embodiment of an imaging device according to the present invention. This imaging device 10 is a digital camera that causes an image pickup element to receive light having passed through a lens, converts the light into a digital signal, and records the signal as image data on a still image or a moving image into a recording medium.

As shown in FIG. 1, the imaging device 10 includes an imaging lens 12, an electronic flash 1 and the like on the front surface, and further includes a shutter release button 2, a power/mode switch 3, a mode dial 4 and the like on the top surface. Meanwhile, as shown in FIG. 2, a liquid crystal monitor 30 for 3D display, a zoom button 5, a cross button 6, a MENU/OK button 7, a playback button 8, a BACK button 9 and the like are arranged on the rear surface of the camera.

The imaging lens 12 may be a collapsible zoom lens. This lens telescopes out of a camera main body by setting a mode of the camera to an imaging mode through the power/mode switch 3. The electronic flash 1 is for illuminating a main subject with flush light.

The shutter release button 2 includes a two-step stroke switch that includes what are called "halfway pressed" and "fully pressed" states. The imaging device 10 operates AE/AF by a "halfway pressed" operation of the shutter release button 2 being pressed halfway during being driven in the imaging mode, and performs imaging by a "fully pressed" operation of the button being further pressed from the "halfway pressed" state. During being driven in the imaging mode, the imaging device 10 performs imaging by the shutter release button 2 being "fully pressed".

The power/mode switch 3 has both of a function as a power switch of turning on and off the power of the imaging device 10 and a function as a mode switch of setting the mode of the imaging device 10, and is arranged slidably among an "OFF position", a "play back position" and an "imaging position". The power of the imaging device 10 is turned on by sliding the power/mode switch 3 to adjust the position to the "play back position" or the "imaging position". The power is turned off by adjusting the position to the "OFF position". The mode is set to the "playback mode" by sliding the power/mode switch 3 to adjust the position to the "playback mode". The mode is set to the "imaging mode" by adjusting the position to the "imaging position".

The mode dial 4 functions as an imaging mode setting device which sets the imaging mode of the imaging device 10. According to the setting position of the mode dial, the imaging mode of the imaging device 10 is set to various modes. For instance, the modes are a "still image taking mode" for taking a still image, a "moving image taking mode" for taking a moving image and the like.

The liquid crystal monitor 30 displays a live view image (through image) in the imaging mode, displays a still image or a moving image in the playback mode, and displays a menu screen and the like, thereby functioning as a part of a graphical user interface (GUI).

The zoom button 5 functions as a zoom instruction device which instructs zooming, and includes a tele button 5T for instructing zooming to a telescopic side and a wide button 5W for instructing zooming to the wide angle side. In the imaging mode, the imaging device 10 changes the focal length of the imaging lens 12 according to operations on the tele button 5T and the wide button 5W. In the playback mode, operations on the tele button 5T and the wide button 5W enlarge and reduce an image being played back.

The cross button 6 is an operation unit for receiving instructions in four directions, which are vertical and horizontal directions, and functions as a button (a cursor movement operation device) for selection of an item from a menu screen, and instructions of selecting various setting items from each menu. A left/right key functions as a frame feeding (forward direction/reverse direction feeding) button in the playback mode.

The MENU/OK button 7 is an operation button that has both a function as a menu button for issuing an instruction for displaying a menu on a screen of the liquid crystal monitor 30 and a function as an OK button for issuing an instruction for determining and executing selection contents.

The playback button 8 is a button for switching the mode to the playback mode for displaying, on the liquid crystal monitor 30, a still image or a moving image which has been taken and recorded.

The BACK button 9 functions as a button for designating cancellation of an input operation and reversal to the previous operation state.

In the imaging device 10 according to this embodiment, dedicated members are not necessarily provided for buttons and switches. Alternatively, a touch panel may be provided; the functions of the buttons and switches may be achieved by operations on this panel.

[Internal Configuration of Imaging Device]

Figure 3:
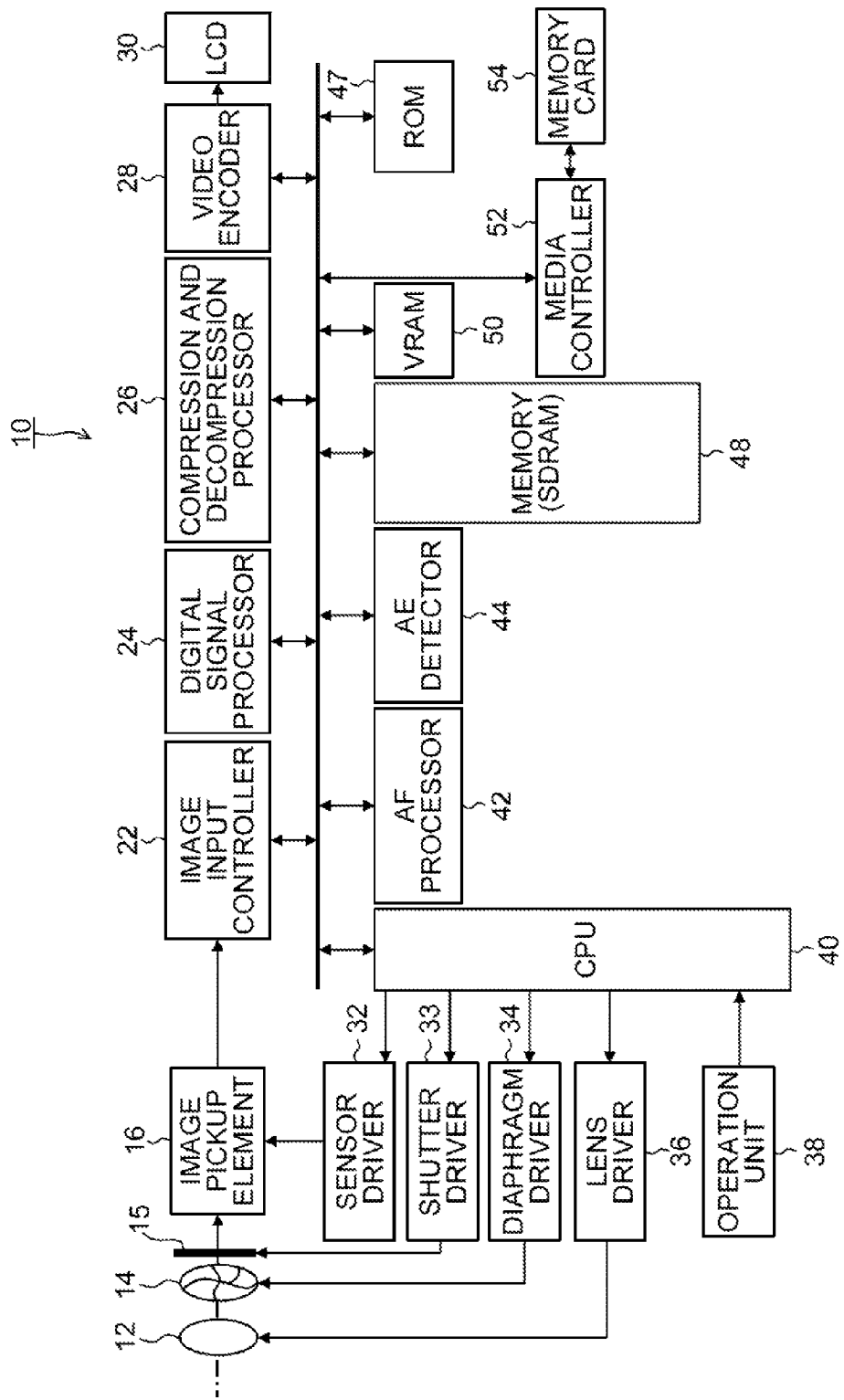
FIG. 3 is a block diagram showing an embodiment of an internal configuration of the imaging device shown in FIG. 1.

FIG. 3 is a block diagram showing an embodiment of an internal configuration of the imaging device 10. The imaging device 10 records taken images in a memory card 54. The overall operation of the device is integrally controlled by a central processing unit (CPU) 40.

The imaging device 10 is provided with an operation unit 38, such as the foregoing shutter release button 2, power/mode switch 3, mode dial 4, tele button 5T, wide button 5W, cross button 6, MENU/OK button 7, playback button 8, and BACK button 9. A signal from the operation unit 38 is input into the CPU 40. The CPU 40 controls each circuit in the imaging device 10 on the basis of the input signal, for instance, to perform image sensor driving control, lens driving control, diaphragm driving control, imaging operation control, image processing control, control of recording/playing back image data, and display control on the liquid crystal monitor 30.

When the power of the imaging device 10 is turned on through the power/mode switch 3, power is supplied from a power source unit, which is not shown, to each block to start driving the imaging device 10.

A light flux having passed through the imaging lens 12, a diaphragm 14, a mechanical shutter (mechanically operated shutter) 15 and the like is image-formed on an image pickup element 16, which is a CMOS (Complementary Metal-Oxide Semiconductor) type color image sensor. The image pickup element 16 is not necessarily the CMOS type. Alternatively, this element may be an XY address type or CCD (Charge Coupled Device) type color image sensor.

In the image pickup element 16, many light receiving elements (photodiodes) are two-dimensionally arranged. A subject image formed on the light receiving surfaces of respective photodiodes is converted into a signal voltage (or charge) according to the amount of incident light, further converted into a digital signal through an A/D converter in the image pickup element 16, and output.

<Embodiment of Image Pickup Element>

The image pickup element 16 has a configuration where color filters arranged in a color filter array exemplified below are provided on respective pixels including photoelectric conversion elements (photodiodes) arranged in a horizontal direction (first direction) and a vertical direction (second direction).

Figure 4:
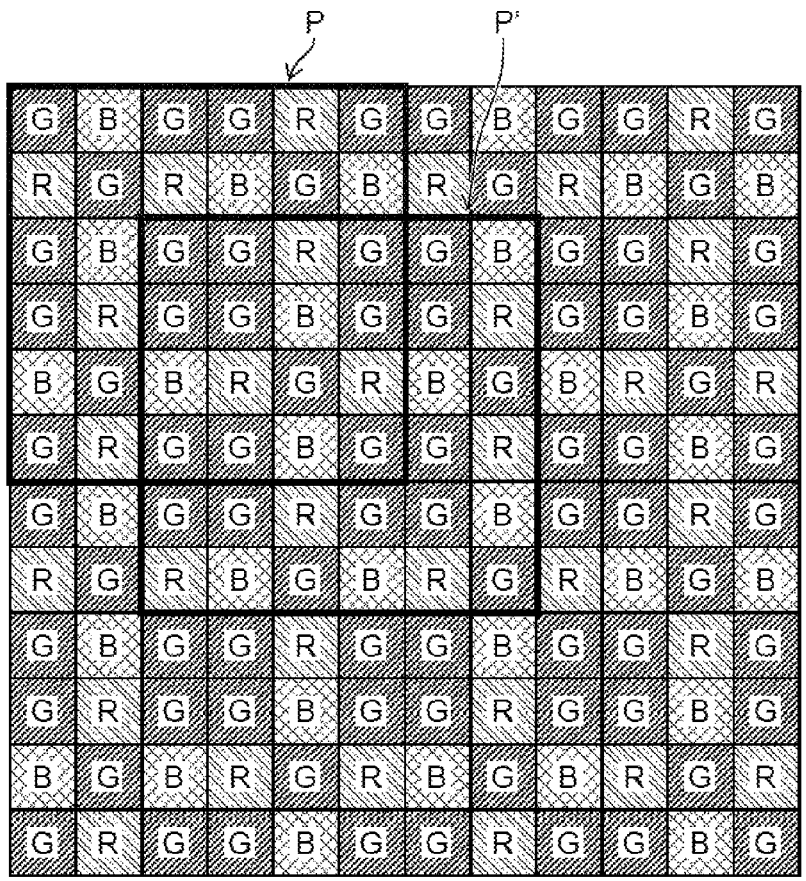
FIG. 4 is a diagram showing a novel color filter array arranged in an image pickup element.

FIG. 4 is a diagram showing an embodiment of the image pickup element 16 and, in particular, shows a novel color filter array arranged on the light receiving plane of the image pickup element 16.

The color filter array of the image pickup element 16 includes a basic array pattern P (pattern indicated by a thick frame) corresponding to M×N (6×6) pixels. This basic array pattern P is arranged repeatedly in the horizontal direction (lateral direction: first direction) and the vertical direction (upper and lower direction: second direction). That is, in this color filter array, filters of colors of red (R), green (G) and blue (B) (R filters, G filters and B filters) are cyclically arranged. Since the R filters, G filters and B filters are thus arranged cyclically, image processing of RAW data of RGB (mosaic image) read from the image pickup element 16 can be performed according to the repetitive pattern.

Note that the 6×6-pixel basic array pattern is not limited to the foregoing basic array pattern P. Alternatively, this pattern may include a basic array pattern P' cut from a position different from the position of the basic array pattern P.

In the color filter array shown in FIG. 4, at least one G filter corresponding to a color that most contributes to acquiring a luminance signal (color of G in this embodiment) is arranged each of pixel lines in the horizontal, vertical, diagonally upper right, and diagonally upper left directions in the color filter array. Here, the pixel line is a line on which one series of pixels are arranged in the horizontal, vertical, diagonally upper right or diagonally upper left direction, and simply referred to as "line" in the following description.

The diagonally upper right direction and the diagonally lower right direction in this embodiment are directions inclined by 45° from the horizontal direction and the vertical direction, respectively. This is because the multiple pixels and color filters are arranged in a square lattice in the horizontal direction and the vertical direction. Accordingly, if the multiple pixels and color filters are arranged in a rectangular lattice, the diagonal directions of the rectangular lattice correspond to the diagonally upper right direction and the diagonally lower right direction.

Since the G filters corresponding to luminance pixels are arranged in each of lines in the horizontal, vertical, diagonally upper right, and diagonally upper left directions in the color filter array, the reproduction accuracy in simultaneous processing in a high frequency region can be improved, irrespective of a direction to be high frequency. Here, the simultaneous processing is a process of calculating color information on all of RGB for each pixel from a RGB mosaic image according to the color filter array of a single plane color image pickup element (conversion into a simultaneous system), and also referred to as a demosaic process or a demosaicing process.

In the color filter array shown in FIG. 4, at least one R filter and at least one B filter corresponding to at least two colors other than the color of G (colors of R and B in this embodiment) are arranged in each of lines in the horizontal and vertical directions in the basic array pattern P.

Since the R filters and the B filters are arranged on each of lines in the horizontal and vertical directions in the color filter array, occurrence of a false color (color moire) can be reduced. This reduction can omit an optical low pass filter for reducing (suppressing) occurrence of a false color. Even in the case of applying an optical low pass filter, a filter having a weak effect of cutting a high frequency component for preventing occurrence of a false color can be applied, thereby preventing the resolution from being degraded.

Furthermore, in the basic array pattern P of the color filter array shown in FIG. 4, the numbers of pixels of R pixels, G pixels and B pixels corresponding to the R filters, G filters and B filters in the basic array pattern are 8 pixels, 20 pixels and 8 pixels, respectively. That is, the ratios of the numbers of pixels of RGB pixels are 2:5:2. The ratio of the number of G pixels that most contributes to acquiring a luminance signal is higher than the ratios of the numbers of the R pixels and the B pixels that have other colors.

As described above, the ratio of the number of pixels of G pixels is different from the ratios of the numbers of pixels of the R and B pixels. In particular, the ratio of the number of pixels of G pixels that most contributes to acquiring a luminance signal is configured to be higher than the ratios of the numbers of pixels of the R and B pixels. Accordingly, aliasing in simultaneous processing can be suppressed, and high frequency reproducibility can be improved.

Figure 5:
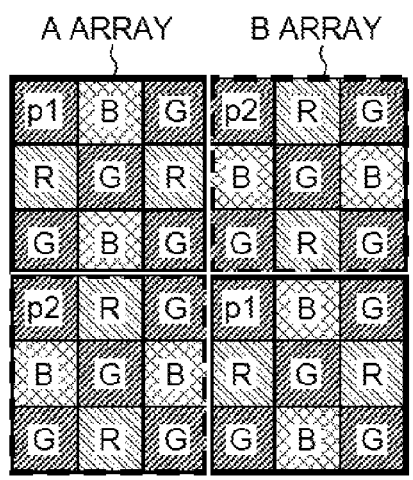
FIG. 5 is a diagram showing a state where a basic array pattern shown in FIG. 4 is divided into four each including 3×3 pixels.

FIG. 5 shows a state where the basic array pattern P shown in FIG. 4 is divided into four each including 3×3 pixels and a first array example of phase difference pixels described later.

As shown in FIG. 5, the basic array pattern P can also be regarded as an array where 3×3-pixel A arrays (first sub-arrays) enclosed by solid line frames and 3×3-pixel B arrays (second sub-arrays) enclosed by broken line frames are alternately arranged in the horizontal and vertical directions.

In each of the A arrays and the B arrays, the G filters (first color) are arranged at the four corners and the center, thus being arranged on both the diagonal lines. In the A array, the R filters (first component color) are arranged in the horizontal direction, and the B filters (second component color) are arranged in the vertical direction, sandwiching the G filter at the center. Meanwhile, in the B array, the B filters are arranged in the horizontal direction, and the R filters are arranged in the vertical direction, sandwiching the G filter at the center. Accordingly, between the A array and the B array, the positional relationships of the R filters and the B filters are replaced with each other, but the other positions are the same.

The G filters at the four corners in the A array and the B array configure the G filters of a square array corresponding to 2×2 pixels by alternately arranging the A arrays and the B arrays in the horizontal direction and the vertical direction.

According to the first array example of the phase difference pixels shown in FIG. 5, the pixel at the position of the upper left G filter among the G filters at the four corners in the A array is configured as the first phase difference pixel p1, and the pixels at the position of the upper left G filter among the G filters at the four corners in the B array is configured as the second phase difference pixel p2.

Figure 6:
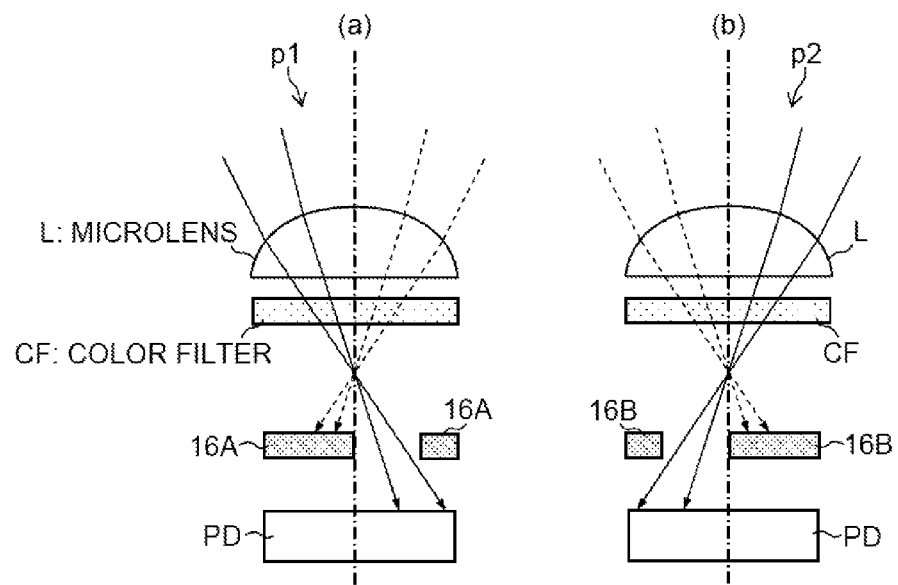
FIG. 6 is a diagram showing examples of configurations of phase difference pixels.

The portions (a) and (b) of FIG. 6 are enlarged diagrams of the main parts of the first phase difference pixel p1 and the second phase difference pixel p2.

As shown in the portion (a) of FIG. 6, a light shield member 16A is provided on a front side (microlens L side) of a photodiode PD of the first phase difference pixel p1. Meanwhile, as shown in the portion (b) of FIG. 6, a light shield member 16B is provided on the front side of a photodiode PD of the second phase difference pixel p2. The microlens L and the light shield members 16A and 16B have functions as a pupil dividing device. As shown in the portion (a) of FIG. 6, the light shield member 16A shields the left half of the light receiving surface of the photodiode PD. Accordingly, the first phase difference pixel p1 only receives a light flux having passed through the left side with respect to the optical axis in a light flux having passed through the exit pupil of the imaging lens 12. As shown in the portion (b) of FIG. 6, the light shield member 16B shields the right half of the light receiving surface of the photodiode PD of the second phase difference pixel p2. Accordingly, the second phase difference pixel p2 only receives a light flux having passed through the right side with respect to the optical axis in the light flux having passed through the exit pupil of the imaging lens 12. Thus, the microlens L and the light shield members 16A and 16B, which are a pupil dividing device, divide the light flux having passed through the exit pupil into the left and right, which enter the first phase difference pixel p1 and the second phase difference pixel p2, respectively.

Figure 7:
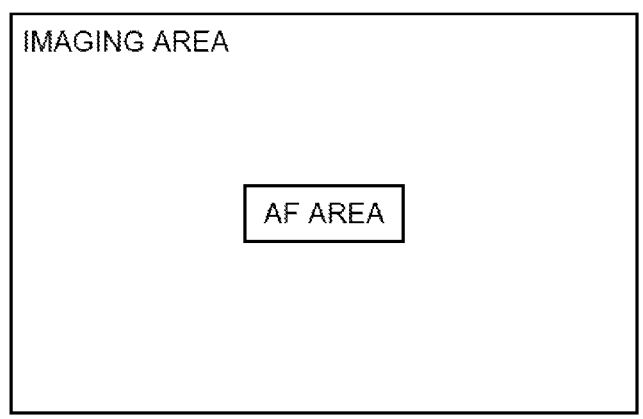
FIG. 7 is a diagram showing an imaging area of an image pickup element and an AF area.

The first phase difference pixel p1 and the second phase difference pixel p2 are provided in an AF area (focal point detection area) at the center in the imaging area of the image pickup element 16 as shown in FIG. 7. It is preferable that about several tens to one hundred of the first phase difference pixels p1 and the second phase difference pixels p2 be arranged in the phase difference detection direction (horizontal direction in this embodiment). It is also preferable that multiple pairs of phase difference pixels be arranged in the vertical direction.

The AF area is not limited to the example shown in FIG. 7. Alternatively, multiple AF areas may be provided in the imaging area as shown in the portions (a) to (c) of FIG. 8, or provided in the entire imaging area.

Returning to FIG. 3, a sensor driver 32 is a color image acquisition device which reads a digital signal (image signal) from the image pickup element 16 according to a reading instruction from the CPU 40, and sequentially reads the image signal from the image pickup element 16 on each line. For instance, when a thinning-reading instruction, such as ⅓-thinning and ⅙-thinning, is applied from the CPU 40, the image signal on the line corresponding to the thinning pattern described later is selectively read.

The reading scheme for a CMOS image sensor that sequentially resets and sequentially reads each one line from the top is known as a rolling shutter scheme. The rolling shutter scheme has a time difference in exposure timing on each line. This difference causes a problem in that an image of a subject is distorted in the case of a moving subject. Accordingly, when a still image is taken, a shutter driver 33 controls a mechanical shutter 15 to open and close (controls exposure time) to prevent distortion from being caused by a rolling shutter. The rolling shutter scheme is a scheme according to which a MOS type image pickup element performs a sequential exposure operation on each at least one scanning line or a pixel; that is, the scheme sequentially resets each scanning line or pixel to start accumulating an electric charge, and reads the accumulated charge (the scheme is also referred to as the focal plane shutter scheme).

The image signals read from the image pickup element 16 (R, G and B signals) are output to an image input controller 22.

A digital signal processor 24 applies signal processing, such as an offset process, white balance correction, a Gamma correction process, simultaneous processing, and YC processing to the digital image signal input via the image input controller 22, and performs a moving image generating process.

The image data processed by the digital signal processor 24 is input into a VRAM 50. The VRAM 50 includes an A area and a B area each of which stores image data representing one frame of an image. Image data representing one frame of the image is alternately rewritten in the A area and the B area in the VRAM 50. The written image data is read from the area other than the area where image data is being rewritten between the A area and the B area of the VRAM 50.

The image data read from the VRAM 50 is encoded by a video encoder 28, and output to a liquid crystal monitor 30 provided on the rear surface of the camera, thereby allowing a subject image to be continuously displayed on the display screen of the liquid crystal monitor 30.

The CPU 40 always performs an AF operation and an AE (automatic exposure) operation during through image taking/displaying (live view imaging) and during moving image taking/recording (image recording).

An AF processor (a phase difference detection device) 42 is a section of performing a phase difference AF process according to the present invention, and detects the phase difference using each output signal of the phase difference pixel p1 and the second phase difference pixel p2 shown in FIG. 5. The phase difference detection by the AF processor 42 is described later in detail. When phase difference data representing a phase difference is input from the AF processor 42, the CPU 40 functions as a focus adjustment device which performs the phase difference AF on the basis of the phase difference data. That is, the CPU 40 calculates an amount of deviation (defocus amount) between the focus position by the imaging lens 12 and the imaging plane of the image pickup element 16 on the basis of the phase difference data, and moves the focusing lens in the imaging lens 12 through a lens driver 36 such that the calculated defocus amount becomes zero. The defocus amount may be calculated by the AF processor 42.

An AE detector 44 integrates the G signals over the entire screen, or integrates the G signals weighted with different weights between the center of the screen and the periphery, and outputs the integrated value to the CPU 40. The CPU 40 calculates the brightness (imaging Ev value) of the subject on the basis of the integrated value input from the AE detector 44. If the imaging mode is the still image taking mode, upon first stage pressing of the shutter release button 2 (half pressing), the CPU 40 performs the foregoing AF control again, and, upon full pressing of the shutter release button 2, the CPU 40 calculates the brightness (imaging Ev value) of the subject, determines the F value of the diaphragm 14 and the exposure time (shutter speed) due to the mechanical shutter 15 on the basis of the calculated imaging Ev value according to a program profile, and takes a still image (exposure control).

On the other hand, if the imaging mode is the moving image taking mode, upon full pressing of the shutter release button 2, the CPU 40 starts taking/recording a moving image (image recording). During moving image taking, the mechanical shutter 15 is opened, image data is continuously read from the image pickup element 16 (e.g., with a frame rate of 30 frame/sec., 60 frame/sec.), phase difference AF is continuously performed, the brightness of the subject is calculated, and the shutter speed (charge storage time by the rolling shutter) is controlled by the sensor driver 32 and/or the diaphragm 14 is controlled by the diaphragm driver 34.

The CPU 40 causes the lens driver 36 to advance and retract the zoom lens in the optical axis direction according to a zoom instruction from the zoom button 5 to change the focal length.

Reference numeral 47 designates a ROM (EEPROM) that stores a camera control program, defective information on the image pickup element 16, various parameters and tables used for image processing etc., and thinning patterns for thinning-reading a moving image, etc.

Image data output from the image pickup element 16 during moving image or still image taking is input from the image input controller 22 into the memory (SDRAM) 48, and temporarily stored.

The image data temporarily stored in the memory 48 is appropriately read by the digital signal processor 24, which performs an offset process, white balance correction, a gain control process including sensitivity correction, a Gamma correction process, simultaneous processing (a process of interpolating spatial deviations between color signals according to the arrangement of the primary color filters to convert the color signals into simultaneous system (demosaic process)), edge enhancing image processing, and a YC process (the process of generating luminance data and color-difference data on the image data); the YC-processed image data (YC data) is stored again in the memory 48.

The YC data stored in the memory 48 is output to a compression and decompression processor 26, subjected to a compression process, such as JPEG (Joint Photographic Experts Group), and subsequently stored in the memory 48 again. An image file is generated from the YC data (compressed data) stored in the memory 48. The image file is read by the media controller 52, and recorded in the memory card 54.

[Phase Difference AF Process]

Figure 9:
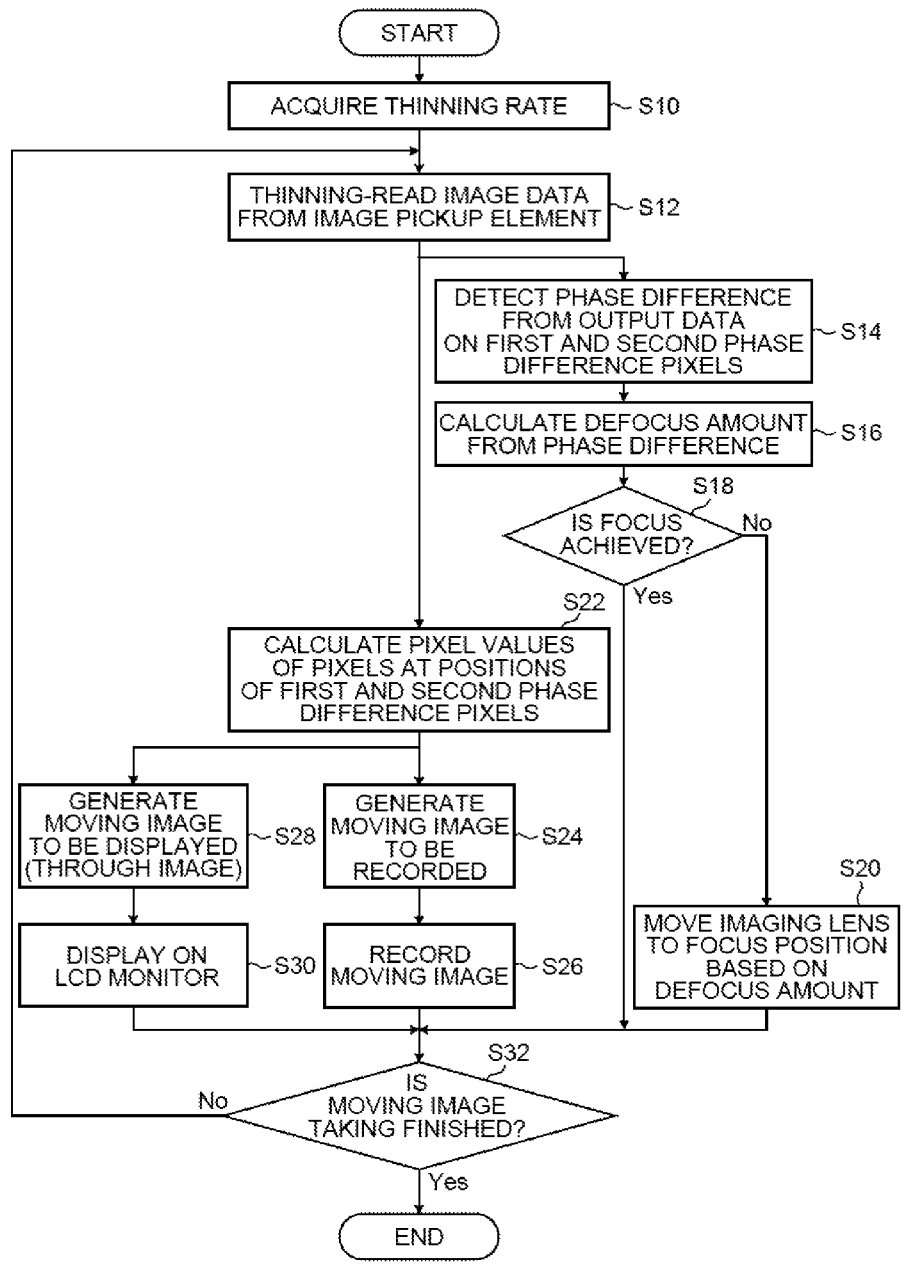
FIG. 9 is a flowchart showing an image processing method according to the present invention.

FIG. 9 is a flowchart showing an image processing method according to the present invention and, in particular, shows image processing during moving image taking.

In FIG. 9, during moving image taking, the CPU 40 acquires a thinning rate for thinning-reading pixel data (image data) from the image pickup element 16 (step S10). The thinning rate may be a preset fixed value, or may be selected by a user from among multiple thinning rates. For instance, the optimal thinning rate can be set in combination with selection of an image size of a moving image or selection of a frame rate.

Subsequently, the CPU 40 outputs a reading instruction of reading a thinning pattern according to the thinning rate to the sensor driver 32, and thinning-reads the image data from the image pickup element 16 (step S12).

Figure 10:
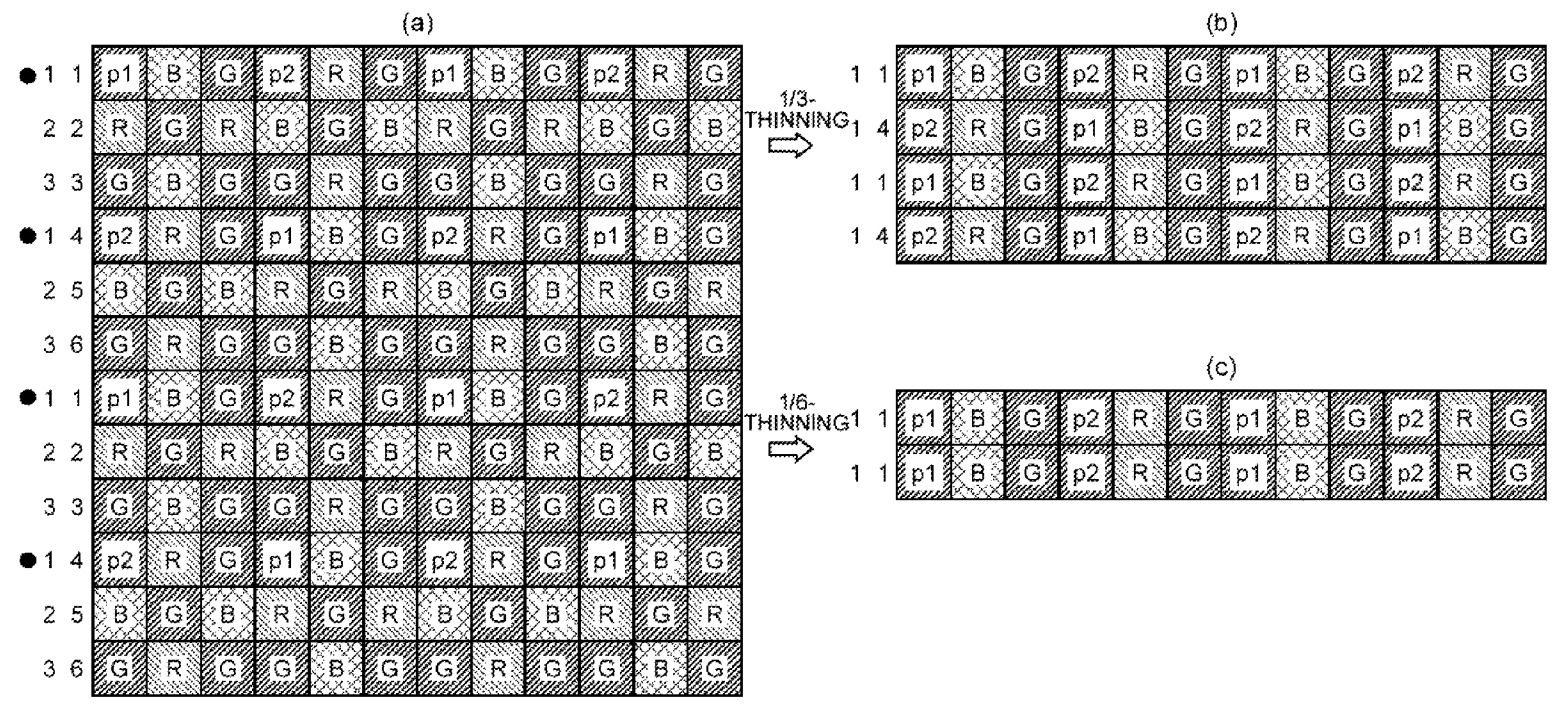

FIG. 10 is a schematic diagram showing a first array example of phase difference pixels in the image pickup element 16, and thinning-reading of image data from the image pickup element 16.

As shown in the (a) portion of FIG. 10, all lines of RAW data (mosaic image) having the same color array as the color filter array of the image pickup element 16 can be read from the image pickup element 16. During moving image taking, ⅓-thinning-reading that thinning-reads one line from every three lines as shown in the (b) portion of FIG. 10, or ⅙-thinning-reading that thinning-reads one line from every six lines as shown in the (c) portion of FIG. 10 can be performed. For instance, reading may be switched such that the ⅓-thinning-reading is performed in an imaging mode at a high resolution, and the ⅙-thinning-reading is performed in an imaging mode at a low resolution or a live view display mode.

The first phase difference pixel p1 and the second phase difference pixel p2 are arranged at the positions of upper left G pixels in the A array and the B array of 3×3 pixels, respectively (see FIG. 5). Accordingly, during thinning-reading, a line that includes the first phase difference pixel p1 and the second phase difference pixel p2 is read. That is, in conformity with the thinning rate, a thinning pattern that indicates lines to be read is preset. Only pieces of pixel data (image data) on lines according to the thinning pattern are read.

Each of the A array and the B array has 3×3 pixels. Accordingly, the A array and the B array are alternately repeated at every three lines in the vertical direction. Meanwhile, the basic array pattern has 6×6 pixels. Accordingly, the same basic array pattern is repeated at every six lines in the vertical direction.

Now, as shown in the (a) portion of FIG. 10, numerals 1 to 3 are assigned to three lines corresponding to the A array or the B array, and numerals 1 to 6 are assigned to six lines corresponding to the basic array pattern P. The first phase difference pixel p1 and the second phase difference pixel p2 are arranged only on the line corresponding to the numeral 1 in the A array or the B array. Accordingly, in the case of the ⅓-thinning-reading, image data on the lines (lines corresponding to numeral 1 and numeral 4 in the basic array pattern) corresponding to numeral 1 in the A array or the B array is read as shown in the (b) portion of FIG. 10. On the other hand, in the case of ⅙-thinning-reading, image data on lines that correspond to numeral 1 in the A array or the B array and also correspond to numeral 1 (or numeral 4) in the basic array pattern is read as shown in the (c) portion of FIG. 10.

Returning to FIG. 9, after one frame of image data is thinning-read in step S12, the AF operation and a process of generating a moving image are performed in parallel as described below.

The AF processor 42 extracts the image data (output data) on the first phase difference pixel p1 and the second phase difference pixel p2 in the AF area in the thinning-read one frame of image data, and detects the phase difference between the output data on the first phase difference pixel p1 and the output data on the phase difference pixel p2 (step S14). For instance, the phase difference is acquired from the amount of shift in the lateral direction between pieces of output data in the case where the correlation between pieces of output data on the upper/lower pair of the first phase difference pixel p1 and the second phase difference pixel p2 is the maximum (the case where the integrated value of absolute value of difference between pieces of output data on the upper/lower pair of the phase difference pixels).

As shown in the (c) portion of FIG. 10, if the first phase difference pixels p1 and the second phase difference pixels p2 are alternately arranged only in the horizontal direction by ⅙-thinning-reading, the phase difference is acquired from the amount of shifts in the lateral direction between pieces of output data in the case of maximizing the correlation between the output data on the first phase difference pixel p1 and the second phase difference pixel p2 in the horizontal direction, and the acquired amount of shift corrected by a positional deviation in the horizontal direction between the first phase difference pixel p1 and the second phase difference pixel p2 is calculated as a phase difference. The method of calculating the phase difference is not limited to the above method. Alternatively, various methods may be applied.

Subsequently, the CPU 40 calculates the amount of deviation (defocus amount) between the focus position according to the imaging lens 12 and the imaging plane of the image pickup element 16 on the basis of the phase difference data from the phase difference detected in step S14 (step S16). The defocus amount may be calculated by the AF processor 42.

The CPU 40 determines whether the focusing lens in the imaging lens 12 is at the focus position or not on the basis of the calculated defocus amount (step S18). If it is determined that the lens is not at the focus position (in the case of "No"), the focusing lens in the imaging lens 12 is moved through the lens driver 36 such that the calculated defocus amount becomes zero (step S20). If it is determined that the lens is at the focus position (in the case of "Yes"), the processing transitions to step S32.

A process of generating a moving image is performed in parallel with the foregoing processes in step S14 to step S20.

After one frame of image data is thinning-read in step S12, in step S22 the pixel values (image data) of the pixels (G pixels) of the first phase difference pixel p1 and the second phase difference pixel p2 are calculated by the interpolating calculation device in the digital signal processor 24. That is, the output data from the first phase difference pixel p1 and the second phase difference pixel p2 cannot be used as image data on the G pixels. Accordingly, the image data on the G pixels at the pixel positions of the first phase difference pixel p1 and the second phase difference pixel p2 is calculated by interpolation with image data on surrounding G pixels (multiple G pixels including the laterally adjacent G pixels in this embodiment). The calculated image data is adopted as image data on the G pixels at the pixel positions of the first phase difference pixel p1 and the second phase difference pixel p2.

Next, the digital signal processor 24 performs the process of generating a moving image to which signal processing, such as white balance correction, a Gamma correction process, simultaneous processing, and YC processing, has been applied, on the basis of the thinning-read R, G and B image data (where the G pixels at the pixel positions of the phase difference pixels are interpolated image data) as shown in the (b) portion of FIG. 10 and the (c) portion of FIG. 10.

As shown in the (b) portion in FIG. 10 and the (c) portion in FIG. 10, in the R, G and B mosaic image having been thinning-read, many G pixels that are normal pixels are arranged around the phase difference pixels. Accordingly, the accuracy of interpolation of phase difference pixels can be improved. Furthermore, since the R, G and B pixels are arranged on all the lines in the horizontal direction, the accuracy of the simultaneous processing can be improved. Moreover, in the mosaic image after ⅓-thinning-reading shown in the (b) portion of FIG. 10, the R pixel and the B pixel are alternately arranged on the lines in the vertical direction. Accordingly, this image can have a higher accuracy of simultaneous processing (demosaic process) than the mosaic image after ⅙-thinning reading in the (c) portion of FIG. 10 has.

Furthermore, the digital signal processor 24 thinning-reads (extracts) the image on the lines in the vertical direction after the simultaneous processing as with the case of thinning-reading of the lines in the horizontal direction (⅓-thinningreading or ⅙-thinning-reading), and generates an image (reduced image) thinning-read in the horizontal direction and the vertical direction.

The moving image generated by the digital signal processor 24 is converted by the compression and decompression processor 26 into compressed moving data, such as in motion JPEG, or MPEG (Moving Picture Experts Group)-4, and subsequently recorded in the memory card 54 via the media controller 52 (step S26).

The digital signal processor 24 generates a moving image to be displayed on the liquid crystal monitor 30 in parallel with generation of the moving image to be recorded (step S28). The moving image to be displayed is an image further reduced in conformity with the display size of the liquid crystal monitor 30. The generated moving image to be displayed is output to the liquid crystal monitor 30 via the video encoder 28, and displayed as a through image (step S30).

The user can verify the image being taken as a moving image by means of the through image displayed on the liquid crystal monitor 30.

Next, the CPU 40 determines whether an instruction of finishing taking the moving image is input from the operation unit 38 (the shutter release button 2 is depressed again) or not (step S32). If the instruction of finishing taking the moving image is input (in the case of "Yes"), the taking/recording the moving image is finished. On the contrary, if the instruction of finishing taking the moving image is not input (in the case of "No"), the processing transitions to step S12 and taking/recording the moving image is continued.

As described above, the imaging device 10 of this embodiment adopts a thinned color image as a target image to be subjected to moving image processing, thereby facilitating reduction of processing time per frame, and preventing the frame rate from decreasing. Furthermore, thinning and reading pixels from the image pickup element 16 can facilitate reduction in time of reading an image from the image pickup element 16.

At least in the AF area in the acquired color image, the first and second phase difference pixels p1 and p2 are arranged at the positions of filters having the same color on the pixel line in the first direction (horizontal direction) on the thinning pattern. Accordingly, the output signals corresponding to the first and second phase difference pixels can be acquired in two dimensions that are in the first direction and the second direction (vertical direction), thereby allowing the phase differences of the output signals to be accurately detected on the basis of the output signals. Thus, in the imaging device 10, phase difference AF can be accurately performed during moving image taking.

Furthermore, at least one of each type of first filters (G filters having the G color) and second filters (R filters and B filters) corresponding to respective colors of second colors (R color and B color) is arranged on each pixel line in the first direction and the second direction in the basic array patterns P and P'. Accordingly, in the case of taking an image (e.g., taking a still image) using the entire pixels without thinning, occurrence of false color in the taken image (still image etc.) can be reduced and high resolution can be achieved. Moreover, the normal pixels (pixels other than the first and second phase difference pixels) can be arranged as pixels around the first and second phase difference pixels. Accordingly, the pixel values of the color pixels at the positions of the first and second phase difference pixels can be accurately acquired when the values are generated by interpolating the pixel values of the surrounding pixels including adjacent pixels. The imaging device 10 can therefore prevent or alleviate reduction in image quality of the taken image through the phase difference pixels p1 and p2.

[Second Array Example of Phase Difference Pixels]

Figure 11:
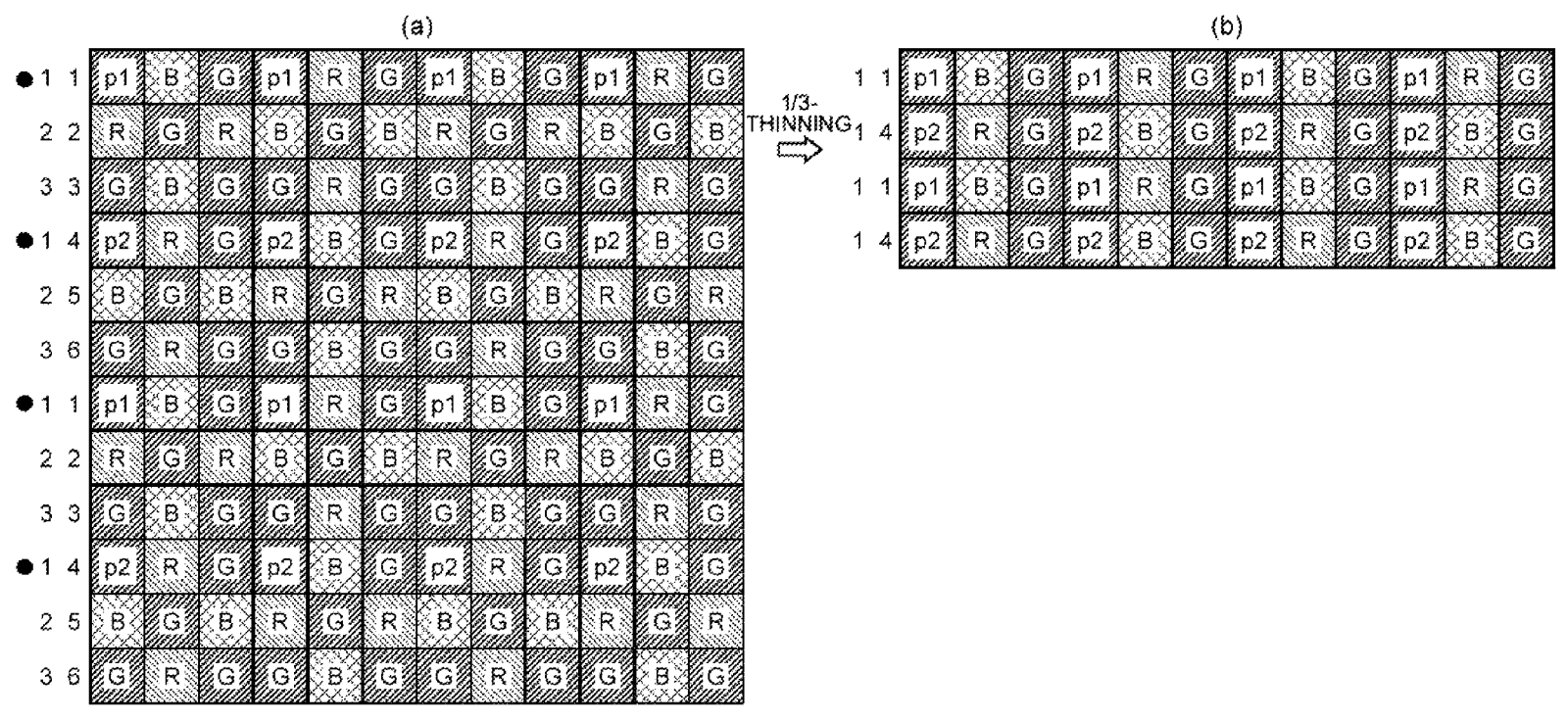

FIG. 11 is a schematic diagram showing a second array example of phase difference pixels in the image pickup element, and thinning-reading of image data from the image pickup element.

As shown in the (a) portion of FIG. 11, in the color filter array of the image pickup element, the 3×3-pixel A arrays and B arrays are alternately arranged in the horizontal direction and the vertical direction. Only one phase difference pixel between the first phase difference pixel p1 and the second phase difference pixel p2 is arranged on the pixel at the position of the upper left G filter among the G filters at the four corners in the A array and the B array in the horizontal direction. Meanwhile, the first phase difference pixel p1 and the second phase difference pixel p2 are alternately arranged on the pixels at the positions of the upper left G filters among the G filters at the four corners in the A arrays and the B arrays in the vertical direction.

In the case of ⅓-thinning-reading, image data on lines (lines corresponding to numeral 1 and numeral 4 of the basic array pattern) corresponding to numeral 1 in the A array or the B array is read as shown in the (b) portion of FIG. 11.

The R, G and B mosaic image after thinning of such thinning-reading has the same color array as that of the mosaic image shown in the (b) portion of FIG. 10. Furthermore, as to the phase difference pixels, the same type of phase difference pixels are arranged in the horizontal direction, and the first phase difference pixel p1 and the second phase difference pixel p2 are alternately arranged in the vertical direction.

Note that since ⅙-thinning-reading can only read lines where only one phase difference pixel between the first phase difference pixel p1 and the second phase difference pixel p2 is arranged, ⅙-thinning-reading cannot be performed; however, the case of ⅙-thinning-reading can acquire the same mosaic image as that of the color array shown in the (b) portion of FIG. 11.

[Third Array Example of Phase Difference Pixels]

Figure 12:
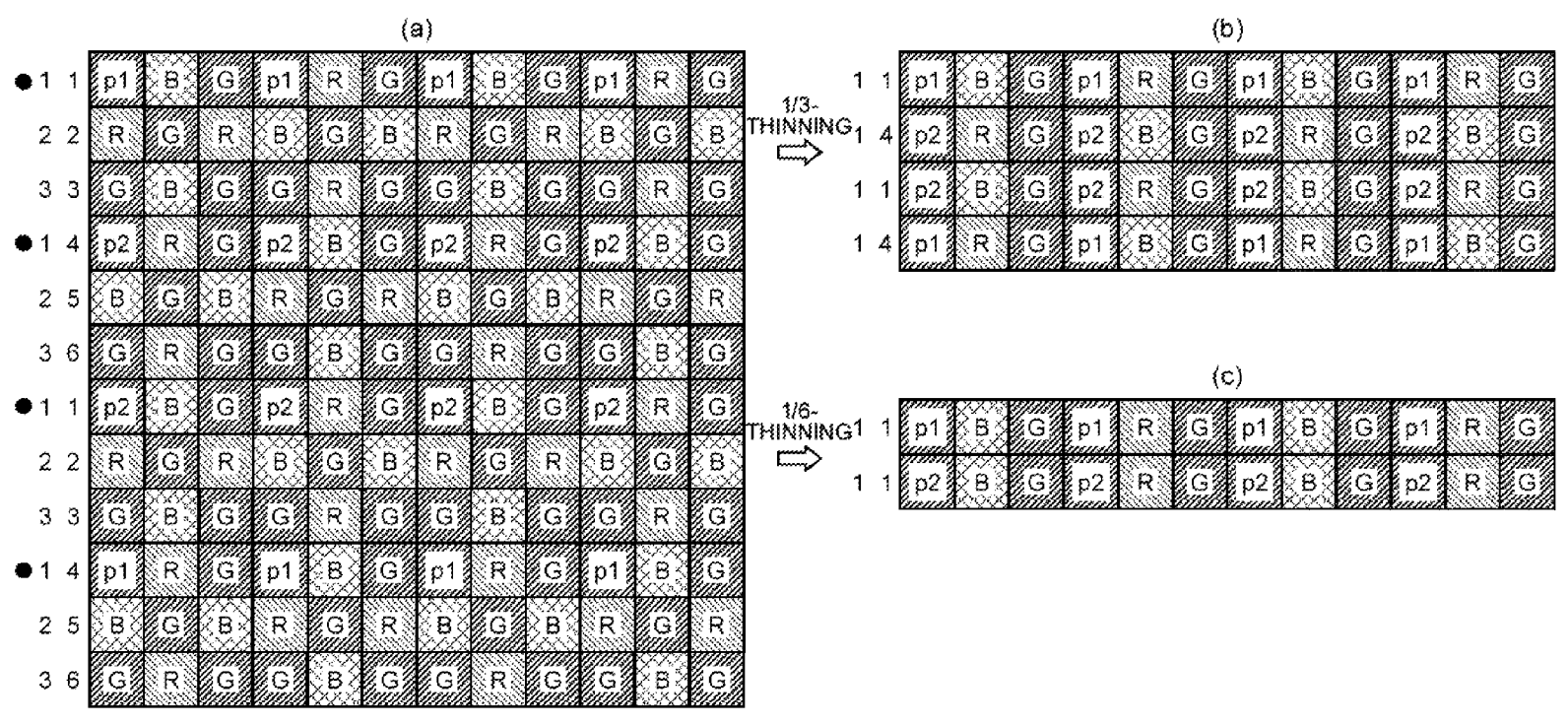

FIG. 12 is a schematic diagram showing a third array example of phase difference pixels in the image pickup element, and thinning-reading of image data from the image pickup element.

As shown in the (a) portion of FIG. 12, in the third array example of the phase difference pixels, the first phase difference pixel p1 and the second phase difference pixel p2 in the vertical direction are not alternately arranged one-by-one, and two first phase difference pixels p1 and two second phase difference pixels p2 are sequentially arranged two-by-two in a manner of p1 and p1, p2 and p2, and p1 and p1 . . . ; this point is different from the case of the second array example shown in the (a) portion of FIG. 11.

In the case of ⅓-thinning-reading, image data on lines (lines corresponding to numeral 1 and numeral 4 of the basic array pattern) corresponding to numeral 1 in the A array or the B array is read as shown in the (b) portion of FIG. 12.

The R, G and B mosaic image after thinning of such thinning-reading has the same color array as that of the mosaic image shown in the (b) portion of FIG. 10. Furthermore, in the phase difference pixels, the same type of phase difference pixels are arranged two-by-two in the horizontal direction, and two pixels that are the first phase difference pixel p1 and the second phase difference pixel p2 are sequentially arranged in the vertical direction.

On the other hand, in the case of ⅙-thinning-reading, image data on lines that correspond to numeral 1 in the A array or the B array and also correspond to numeral 1 (or numeral 4) in the basic array pattern is read as shown in the (c) portion of FIG. 12. In the R, G and B mosaic image after ⅙-thinning-reading, the R, G and B pixels are arranged in the vertical direction in a manner of stripes as shown in the (c) portion of FIG. 12. Accordingly, the mosaic image after ⅓-thinning-reading where the R pixels and the B pixels are alternately arranged on the lines in the vertical direction as shown in the (b) portion of FIG. 12 can have a higher accuracy of simultaneous processing than the mosaic image after ⅙-thinning-reading shown in the (c) portion of FIG. 12 has.

[Four Array Example of Phase Difference Pixels]

Figure 13:
FIG. 13 is a schematic diagram showing a fourth array example of phase difference pixels in the image pickup element and thinning-reading of image data from the image pickup element.

FIG. 13 is a schematic diagram showing a fourth array example of phase difference pixels in the image pickup element, and thinning-reading of image data from the image pickup element.

As shown in the (a) portion of FIG. 13, the fourth array example of the phase difference pixels has the different arrangement positions of the second phase difference pixel p2 in the 3×3-pixel A array and B array from those in the second array example shown in the (a) portion of FIG. 11; in the fourth array example, the second phase difference pixel p2 is arranged at the position of the upper right G filters among the G filters at the four corners of the A array and the B array.

Accordingly, the first phase difference pixel p1 and the second phase difference pixel p2 are not arranged in one line in the vertical direction, but are arranged at positions alternately deviating from each other.

In the case of ⅓-thinning-reading, image data on lines (lines corresponding to numeral 1 and numeral 4 of the basic array pattern) corresponding to numeral 1 in the A array or the B array is read as shown in the (b) portion of FIG. 13.

The R, G and B mosaic image after thinning of such thinning-reading has the color array analogous to that of the mosaic image shown in the (b) portion of FIG. 10. However, the first phase difference pixel p1 and the second phase difference pixel p2 are arranged in a staggered manner (analogous to a checkered flag), and the normal G pixels are also arranged in a staggered manner. Accordingly, image data on G pixels at the pixel positions of the first phase difference pixel p1 and the second phase difference pixel p2 can be accurately calculated through interpolation.

[Fifth Array Example of Phase Difference Pixels]

Figure 14:
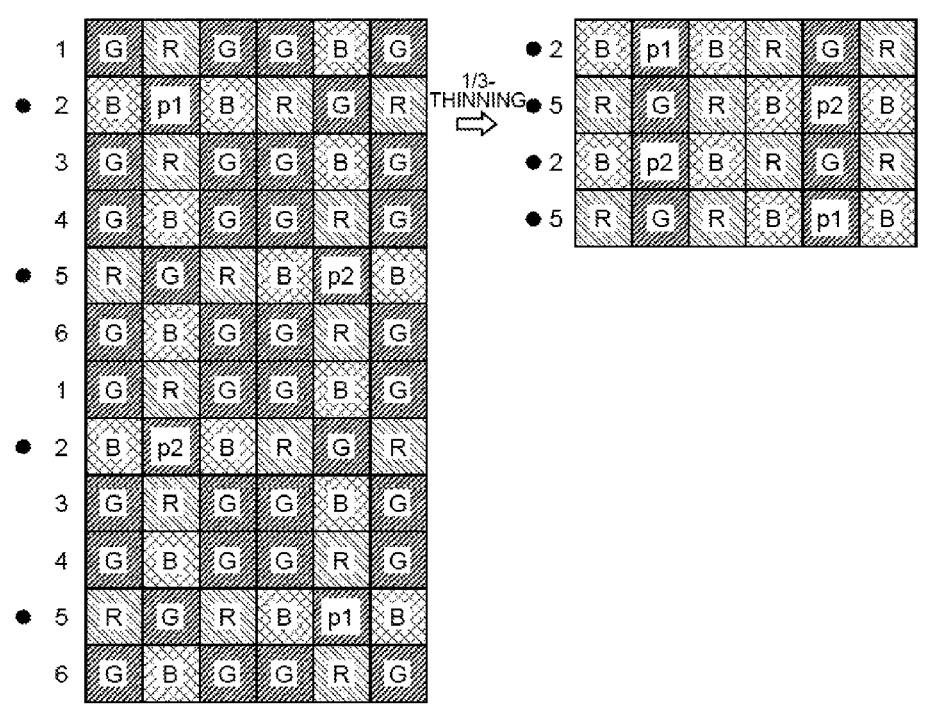

FIG. 14 is a schematic diagram showing a fifth array example of phase difference pixels in the image pickup element, and a state of thinning-reading of image data from the image pickup element.

As shown in the (a) portion of FIG. 14, in the a fifth array example of a phase difference pixel, the first phase difference pixel p1 and the second phase difference pixel p2 are arranged only at the positions of the G filters at the centers of 3×3-pixel A arrays.

In the case of ⅓-thinning-reading, image data on lines (lines corresponding to numeral 2 and numeral 5 of the basic array pattern) corresponding to numeral 2 in the A array or the B array is read as shown in the (b) portion of FIG. 14.

The R, G and B mosaic image after thinning of such thinning-reading has a small number of G pixels as shown in the (b) portion of FIG. 14. The ratios of the numbers of R, G and B pixels in the AF area are 1:2:1 in the foregoing first to fourth array examples, but 2:1:2 in the fifth array example.

Accordingly, according to the first to fourth array examples, the pixel values of G pixels where the phase difference pixels are arranged can be acquired more accurately than the case of the fifth array example, and it is more difficult to cause false color and the resolution can be higher in comparison with the case of the fifth array example.

[Sixth Array Example of Phase Difference Pixels]

Figure 15:
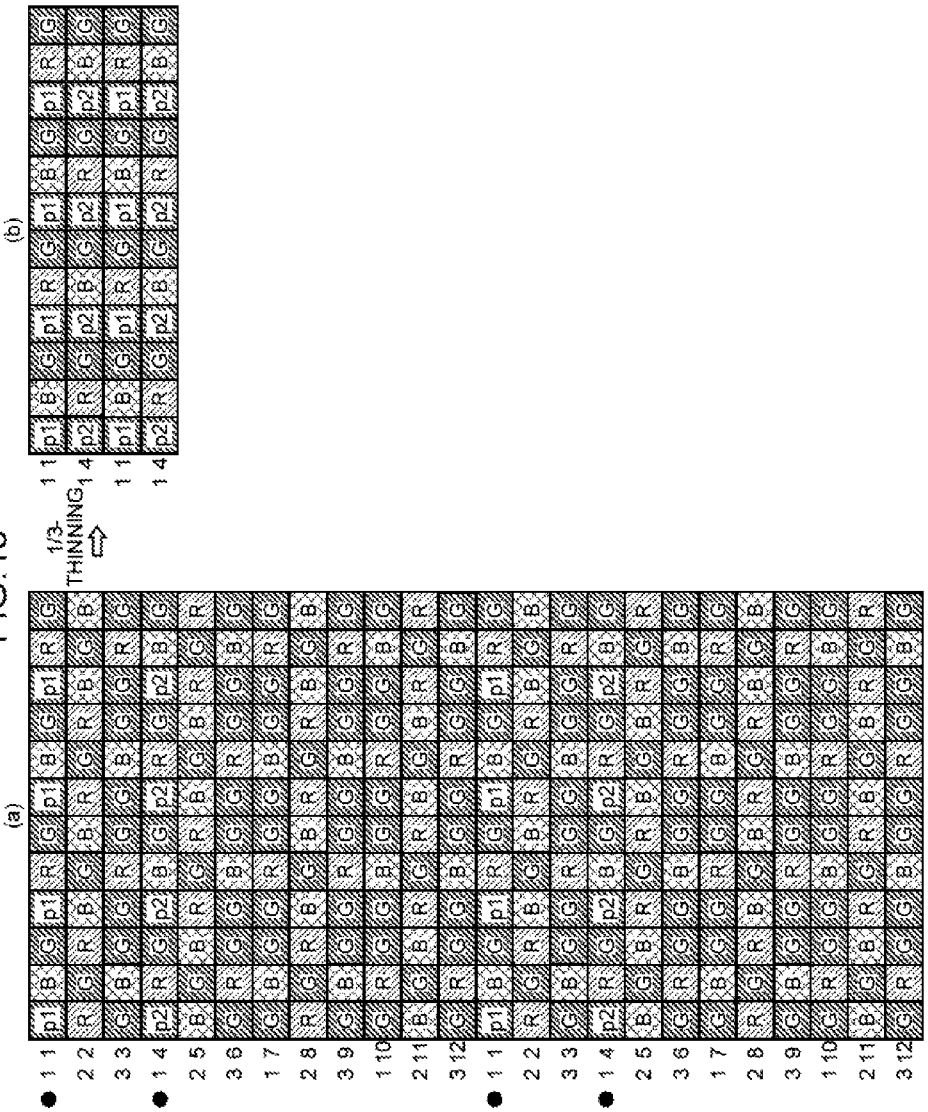
FIG. 15 is a schematic diagram showing a sixth array example of phase difference pixels in the image pickup element, and a diagram used for illustrating a method of determining the subject color on the basis of means signal of pixels in an AF area.

FIG. 15 is a schematic diagram showing a sixth array example of phase difference pixels in the image pickup element, and a state of thinning-reading of image data from the image pickup element.

As shown in the (a) portion of FIG. 15, the sixth array example of the phase difference pixels is analogous to the second array example shown in FIG. 11, but is different in that the phase difference pixels are arranged in the basic array patterns disposed alternately among the basic array patterns arranged in the vertical direction.

During thinning-reading, image data on lines (lines corresponding to numeral 1 in the A array or B array (lines corresponding to numeral 1 and numeral 4 of the basic array pattern)) where phase difference pixels are arranged in the alternate basic array patterns is read as shown in the (b) portion of FIG. 15.

The R, G and B mosaic image after thinning of such thinning-reading is an image analogous to that shown in the (b) portion of FIG. 11. Furthermore, the arrangement positions of the phase difference pixels in the images are the same as each other.

The sixth array example and thinning-reading of the phase difference pixels shown in FIG. 15 can improve the thinning rate, and reduce time for reading one frame of image data.

[Seventh Array Example of Phase Difference Pixels]

Figure 16:
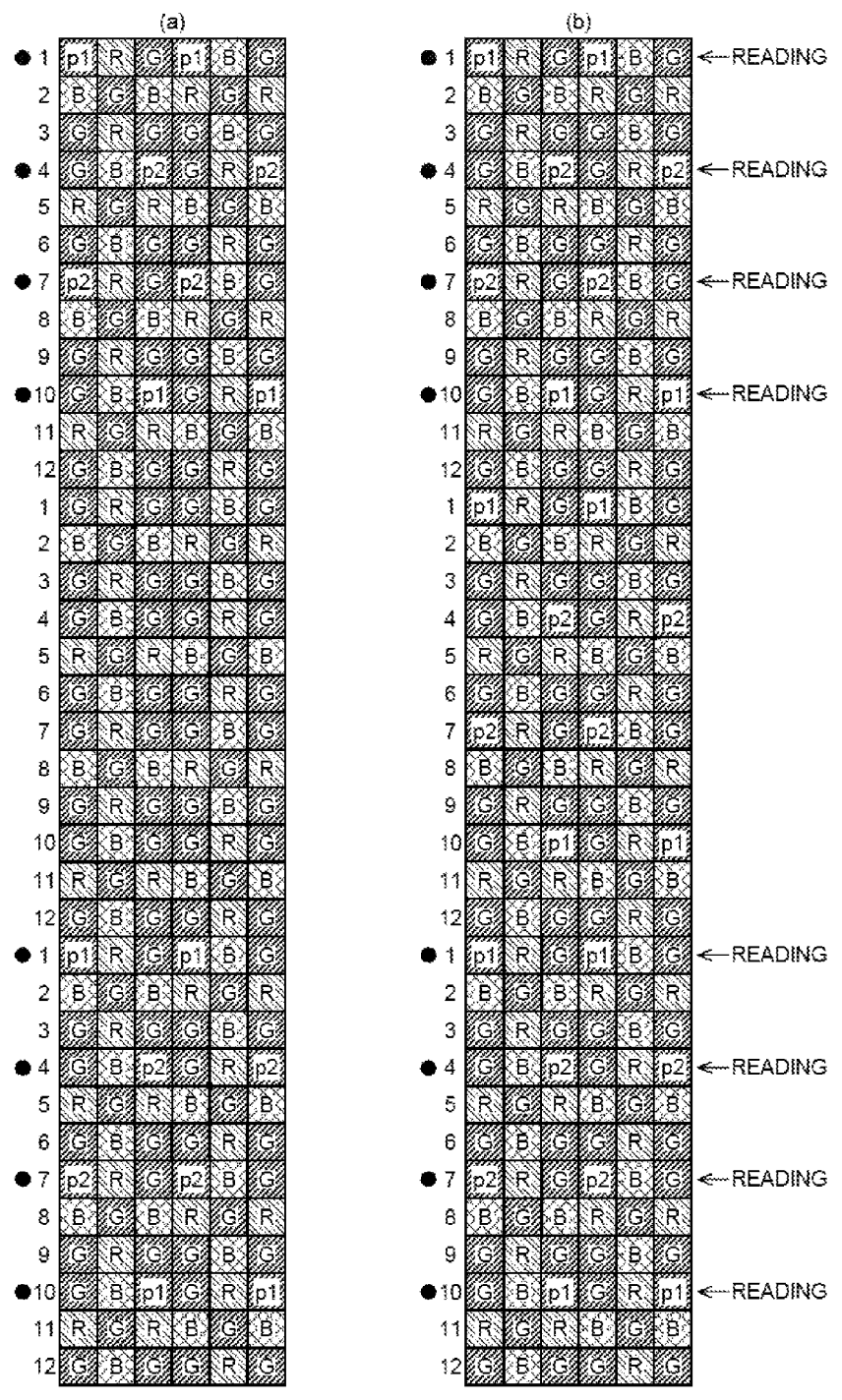

A portion (a) of FIG. 16 is a diagram showing a seventh array example of phase difference pixels in the image pickup element.

In the image pickup element shown in the (a) portion of FIG. 16, two continuous basic array patterns where the phase difference pixels are arranged and two continuous basic array patterns where no phase difference pixel is arranged are alternately arranged among the basic array patterns arranged in the vertical direction.

In one basic array pattern between the two basic array patterns where the phase difference pixels are arranged, the first phase difference pixels p1 are arranged at the positions of the upper left G filters among G filters at the four corners of the upper A array and B array, and the second phase difference pixels p2 are arranged at the positions of the upper right G filters among G filters at the four corners of the lower A array and B array. In the other basic array pattern, the second phase difference pixels p2 are arranged at the positions of the upper left G filters among G filters at the four corners of the upper A array and B array, and the first phase difference pixels p1 are arranged at the positions of the upper right G filters among G filters at the four corners of the lower A array and B array.

Numerals 1 to 12 are assigned to 12 lines corresponding to the two basic array patterns where the phase difference pixels are arranged. Then, during thinning-reading, image data on lines 1, 4, 7 and 10 where the phase difference pixels are arranged are thinning-read.

As shown in the (b) portion of FIG. 16, the first phase difference pixel p1 and the second phase difference pixel p2 may be arranged in all the basic array patterns in the AF area as with the case of the (a) portion of FIG. 16, and only lines identical to the reading lines of the seventh array example of the (a) portion of FIG. 16 may be read from among the lines 1, 4, 7 and 10 where the phase difference pixels are arranged.

[Another Embodiment of Color Filter Array]

The color filter array is not limited to the array shown in FIG. 4 and the like. Alternatively, the array as shown in FIG. 17 may be adopted.

Figure 17:
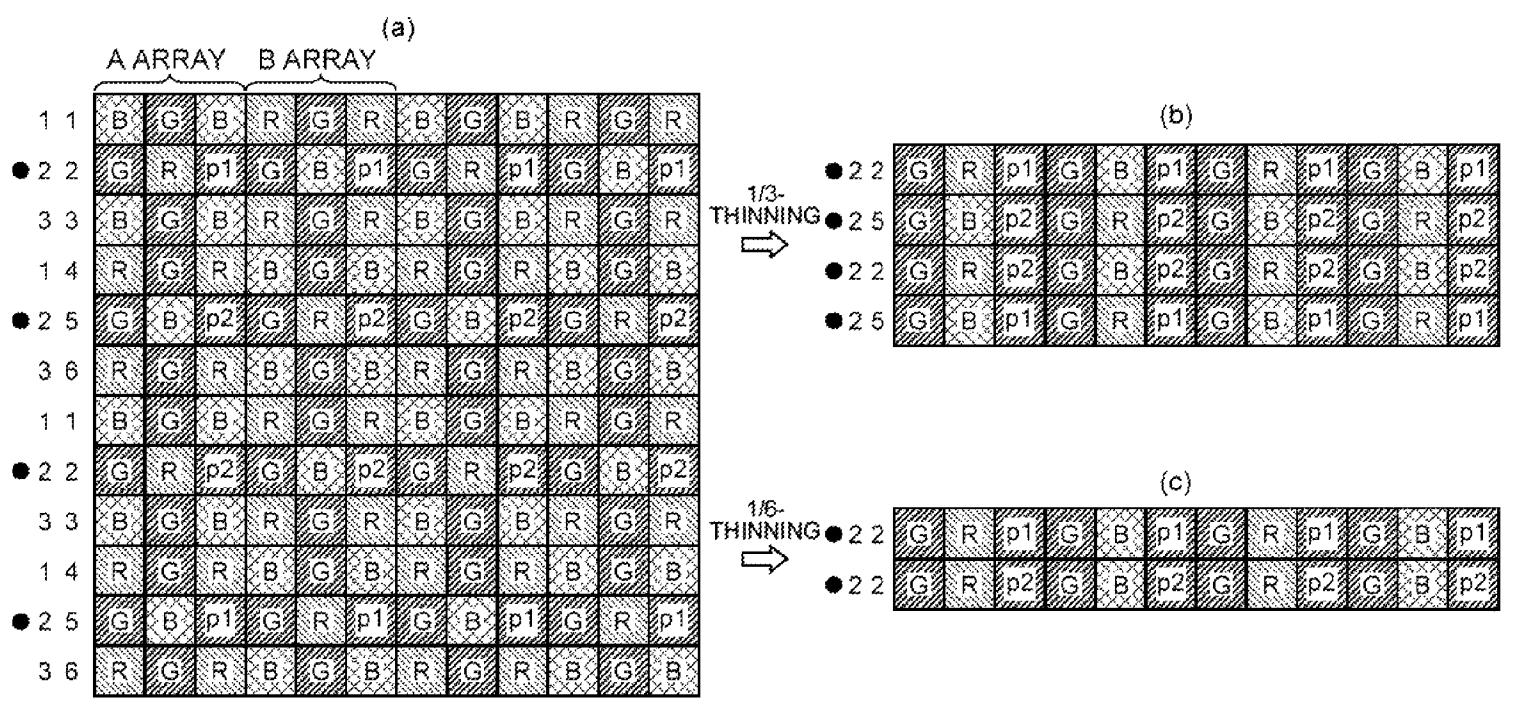

The color filter array shown in FIG. 17 includes basic array patterns each including a square array pattern corresponding to 6×6 pixels, and is common to the color filter array shown in FIG. 4 and the like in that the basic array pattern is repeatedly arranged in the horizontal direction and the vertical direction. However, the arrangements of filters with R, G and B colors in the basic array pattern are different from each other.

That is, the basic array pattern of the color filter array shown in FIG. 17 is thus divided into four each including 3×3 pixels, and an array is acquired where the 3×3-pixel A array and B array are alternately arranged in the horizontal direction and the vertical direction.

In the A array, the R filter is arranged at the center, the B filters are arranged at the four corners, and the G filters are arranged upper, lower, left and right sandwiching the R filter at the center. Meanwhile, in the B array, the B filter is arranged at the center, the R filters are arranged at the four corners, and the G filters are arranged upper, lower, left and right sandwiching the B filter at the center. Between these A array and B array, the positional relationships of the R filters and the B filters are replaced with each other, but the other positions are the same.

As shown in FIG. 17, the first phase difference pixel p1 and the second phase difference pixel p2 are arranged at pixel positions corresponding to the right G filters among the upper, lower, left and right G filters in the A array and the B array. Furthermore, two units of the first phase difference pixel p1 and the second phase difference pixel p2 in the vertical direction are continuously arranged.

Here, in the case of ⅓-thinning-reading of image data during moving image taking, image data on lines (lines corresponding to numeral 2 and numeral 5 of the basic array pattern) corresponding to numeral 2 in the A array or the B array is read as shown in the (b) portion of FIG. 17.

The R, G and B mosaic image after thinning of such thinning-reading has the same color array as that of the mosaic image shown in the (b) portion of FIG. 12, and has the same array of the phase difference pixels as that shown in the portion (b) of FIG. 12.

On the other hand, in the case of ⅙-thinning-reading, image data on lines that correspond to numeral 2 in the A array or the B array and also correspond to numeral 2 (or numeral 5) in the basic pattern is read as shown in the (c) portion of FIG. 17. In the R, G and B mosaic image after ⅙-thinning-reading, the R, G and B pixels are arranged in the vertical direction in a manner of stripes as shown in the (c) portion of FIG. 17. Accordingly, the mosaic image after ⅓-thinning-reading where the R pixels and the B pixels are alternately arranged on the lines in the vertical direction as shown in the (b) portion of FIG. 17 can have a higher accuracy of simultaneous processing than the mosaic image after ⅙-thinning-reading shown in the (c) portion of FIG. 17 has.

[Another Array Example of Phase Difference Pixels in the Image Pickup Element]

Figure 18:
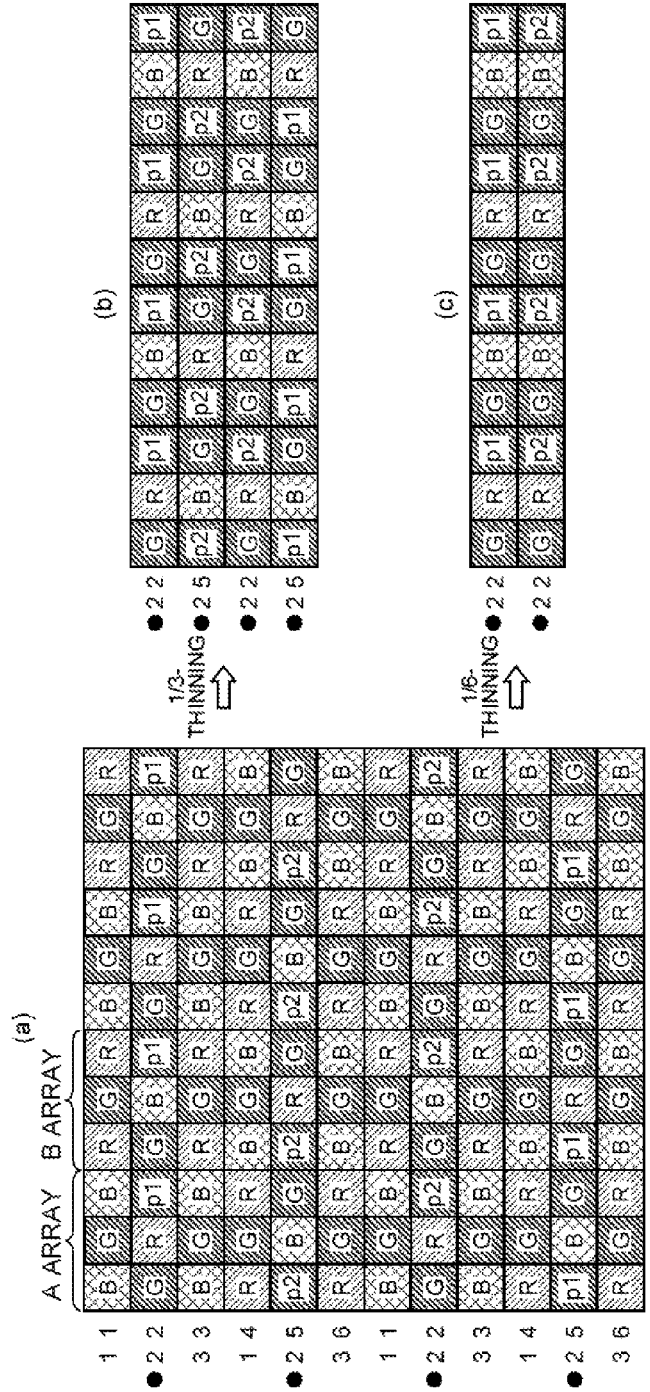

FIG. 18 is a schematic diagram showing another array example of phase difference pixels in the image pickup element shown in FIG. 17 and a state of thinning-reading of image data from the image pickup element.

As shown in the (a) portion of FIG. 18, another array example of the phase difference pixels has the different arrangement positions of the phase difference pixels in the even-numbered A arrays and B arrays from those in the array example shown in the (a) portion of FIG. 17; the pixels are arranged at the pixel positions corresponding to the G left filters among the upper, lower, left and right G filters in the A arrays and the B arrays.

Accordingly, the first phase difference pixel p1 and the second phase difference pixel p2 are not arranged in one line in the vertical direction, but are arranged at positions alternately deviating from each other.

In the case of ⅓-thinning-reading, image data on lines (lines corresponding to numeral 2 and numeral 5 of the basic array pattern) corresponding to numeral 2 in the A array or the B array is read as shown in the (b) portion of FIG. 18.

The R, G and B mosaic image after thinning of such thinning-reading has the color array analogous to that of the mosaic image shown in the (b) portion of FIG. 17. However, the first phase difference pixel p1 and the second phase difference pixel p2 are arranged in a staggered manner (analogous to a checkered flag), and the normal G pixels are also arranged in a staggered manner. Accordingly, image data on G pixels at the pixel positions of the first phase difference pixel p1 and the second phase difference pixel p2 can be accurately calculated through interpolation.

On the other hand, in the case of ⅙-thinning-reading, image data on lines that correspond to numeral 2 in the A array or the B array and also correspond to numeral 2 (or numeral 5) in the basic array pattern is read as shown in the (c) portion of FIG. 18. The R, G and B mosaic image and the arrangement of the phase difference pixels after ⅙-thinning-reading are the same as those shown in the (c) portion of FIG. 17.

[Another Embodiment of Thinning-Reading]

The thinning-reading of image data shown in FIG. 10 to FIG. 18 selects lines (horizontal lines) in the horizontal direction of the image pickup element, and thinning-reads image data on the selected horizontal lines. However, the thinning-reading is not limited thereto. Alternatively, thinning-reading may select horizontal lines and lines (vertical lines) in the vertical direction of the image pickup element, and thinning-read image data on pixels at positions where the selected horizontal lines and vertical lines intersect with each other.

Figure 19:
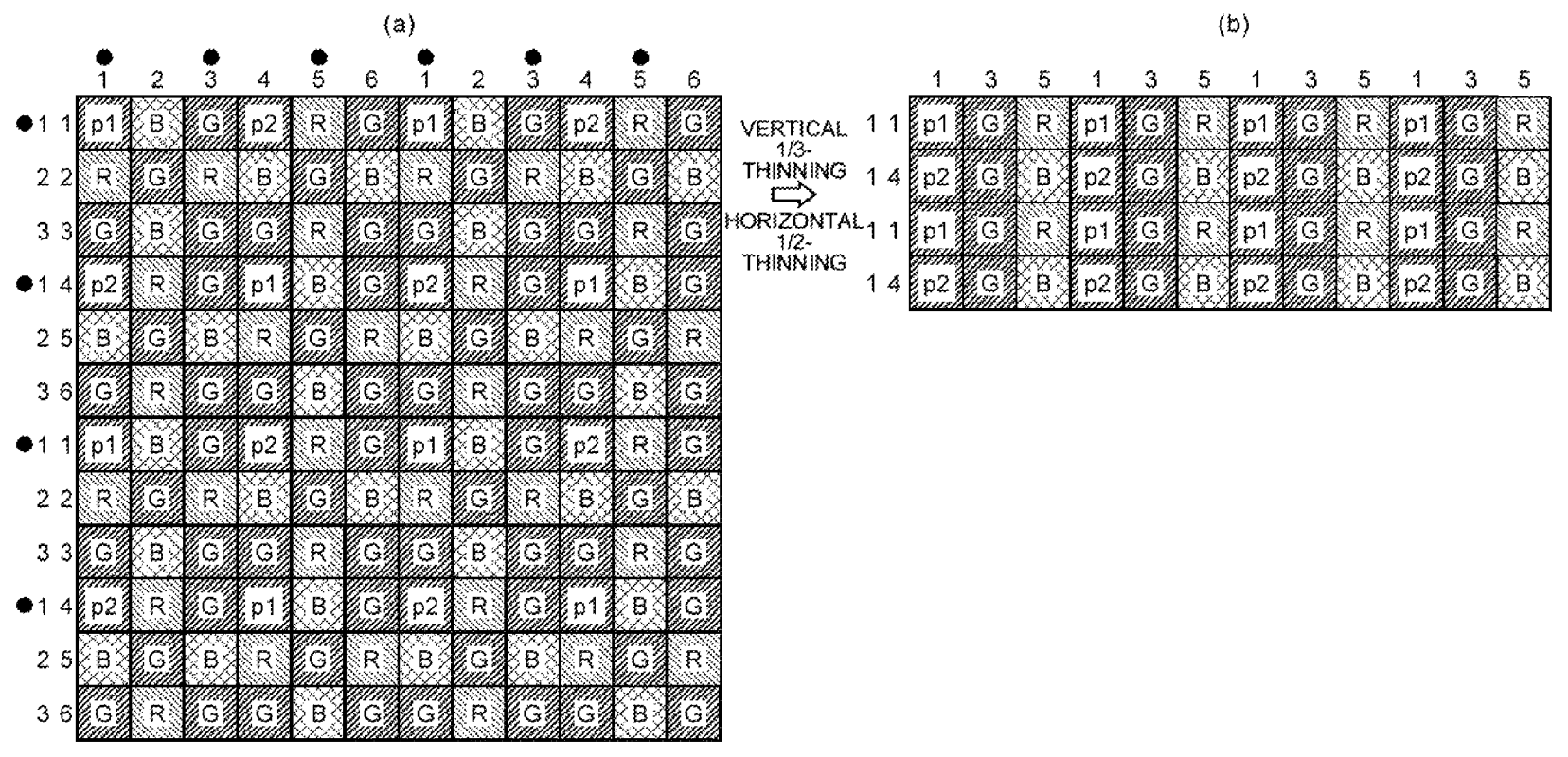

A portion (a) of FIG. 19 is a diagram showing a color filter array identical to the color filter array of the image pickup element shown in the (a) portion of FIG. 10, and a first array example of phase difference pixels.

In the case of thinning-reading where pixels on vertical lines are ⅓-thinning-read (vertical ⅓-thinning-reading) and pixels in the horizontal lines are ½-thinning-read (horizontal ½-thinning-reading) in the image pickup element shown in the (a) portion of FIG. 19, that is, in the case of reading pixels at positions where the horizontal lines and vertical lines indicated by black circles in the (a) portion of FIG. 19 intersect with each other, an R, G and B mosaic image can be acquired as shown in the (b) portion of FIG. 19.

Thus, the R, G and B mosaic image after the vertical ⅓-thinning-reading and horizontal ½-thinning-reading is a mosaic image analogous to an image having the color array shown in the (b) portion of FIG. 11.

Accordingly, many G pixels that are normal pixels are arranged around the phase difference pixels. The accuracy of interpolation of phase difference pixels can therefore be improved. Furthermore, since the R, G and B pixels are arranged on all the lines in the horizontal direction and the R pixels and B pixels are alternately arranged on the lines in the vertical direction, the accuracy of the simultaneous processing can be improved.

Figure 20:
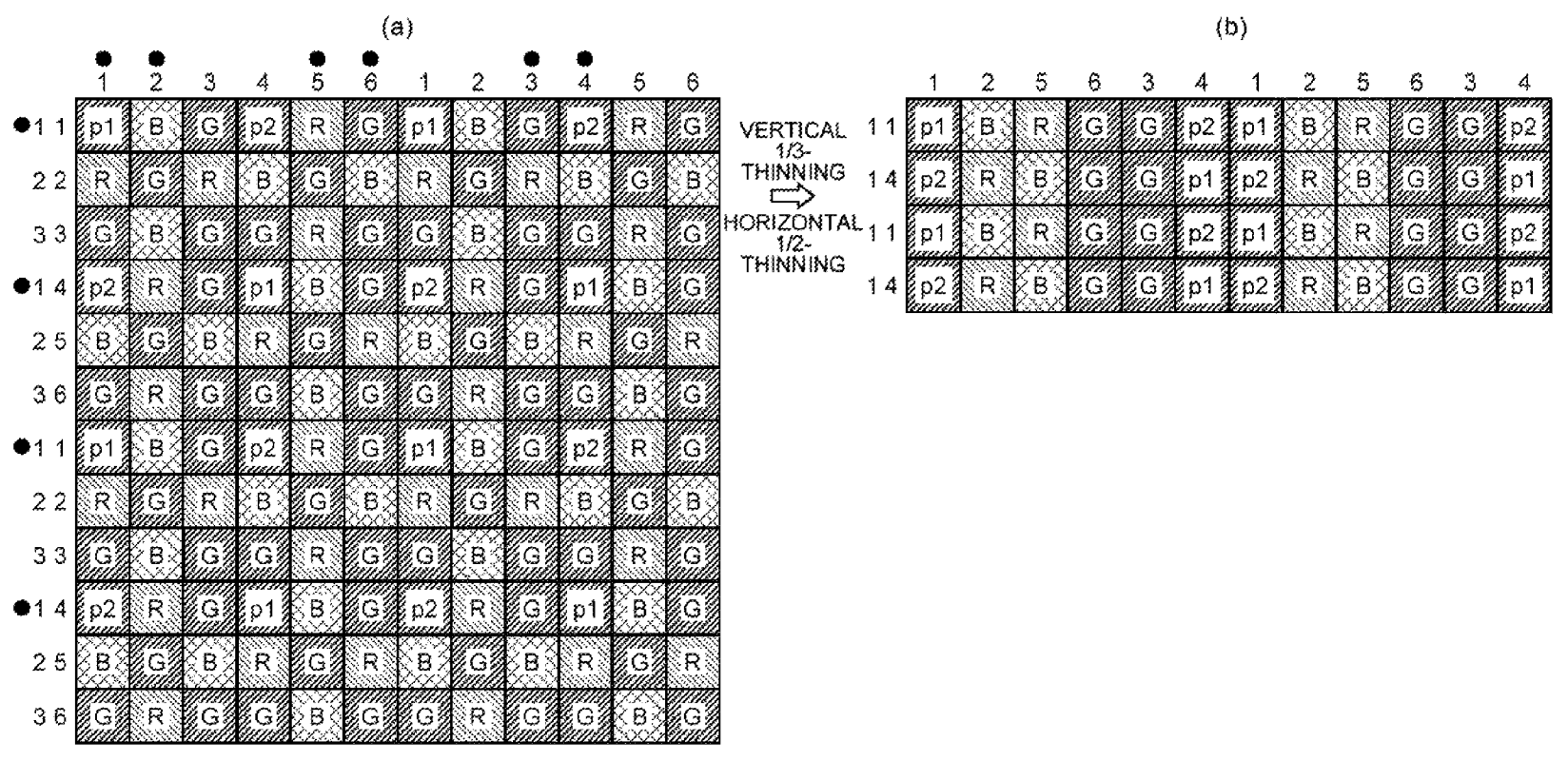

FIG. 20 is a diagram showing a variation example of thinning-reading shown in FIG. 19. As described in the (a) portion of FIG. 20, in the case of horizontal ¾-thinning-reading from the horizontal lines, two pixels to be read and two pixels not to be read are alternately repeated.

The (b) portion of FIG. 20 shows an R, G and B mosaic image after thinning-reading. In the mosaic image shown in the (b) portion of FIG. 12, the R, G and B pixels are arranged on all the lines in the horizontal direction, and the R pixels and B pixels are alternately arranged on lines in the vertical direction. Accordingly, the accuracy of simultaneous processing can be improved.

In the horizontal, vertical, horizontal, vertical, diagonally upper right, and diagonally upper left directions, continuous G pixels are arranged. Accordingly, through use of information on the G pixels on continuous two pixels, a direction having a high correlation can be determined from among the horizontal, vertical, diagonally upper right, and diagonally upper left directions. This determination result on the direction can be used for a process (simultaneous processing) of interpolation from surrounding pixels. Preferably, in this case, for instance, a direction determining processor is provided in the foregoing digital signal processor 24, and this direction determining processor determines the direction.

[Another Embodiment]

<Another Embodiment of Image Pickup Element Having Pixels Other Than R, G and B>

In each of the foregoing embodiments, the description has been made, exemplifying the G filters having the G color as the first filters having the first color. Alternatively, instead of the G filters, or instead of some of the G filters, filters that satisfy any of the following condition (1) to condition (4) may be adopted.

<Condition of First Filter (First Color)>

[Condition (1)]

The condition (1) is that the contribution ratio for acquiring a luminance signal is at least 50%. The contribution ratio of 50% is a value defined so as to discriminate the first color (G color or the like) of the present invention from the second colors (colors of R, B, etc.), and is a value defined such that a color having a relatively higher contribution ratio for acquiring luminance data than the R color, the B color, etc. have is included in the "first color".

The image signal of the G pixels has a higher contribution ratio during generation of the luminance signal than image signals of the R pixels and the B pixels have. More specifically, the luminance signal (Y signal) of a certain pixel after simultaneous processing is generally calculated by the following expression on the basis of simultaneous-processed R, G and B image signals (R, G and B signals).

$$Y = 0.3R + 0.6G + 0.1B$$ [Expression 1]

According to this [Expression 1], the contribution ratio of G color is 60%. Accordingly, the G color has a higher contribution ratio than the R color (contribution ratio of 30%) and the B color (contribution ratio of 10%) have. Thus, the G color is a color that most contributes to the luminance signal among the three primary colors.

Furthermore, the contribution ratios of colors other than the G color can be also acquired by an experiments or simulation. Accordingly, a filter with a color that is other than the G color and has a contribution ratio of at least 50% may be adopted as the first filter of the present invention. Note that colors having contribution ratios less than 50% may be adopted as the second colors of the present invention (R color, B color, etc.). The filter having this color is adopted as the second filter of the present invention.

[Condition (2)]

The condition (2) is that the peak of the transmittance of the filter is a wavelength within a range from 480 nm to 570 nm. For instance, a value measured by a spectrophotometer is used as the transmittance of the filter. This wavelength range is a range defined so as to discriminate the first color of the present invention (G color) from the second colors (R, B color, etc.), and is a range defined so as not to include the peaks of the R color and the B color where the foregoing contribution ratios are relatively low but so as to include the peak of the G color where the contribution ratio is relatively high. Accordingly, a filter whose peak of the transmittance is a wavelength within the range from 480 nm to 570 nm can be used as the first filter. Note that filters whose peaks of the transmittance are wavelengths within a range from 480 nm to 570 nm can be used as the second filters of the present invention (R filter, B filter).

[Condition (3)]

The condition (3) is that the transmittance at a wavelength within a range from 500 nm to 560 nm is higher than the transmittance of the second filters (R filter and B filter). Also with this condition (3), for instance, a value measured by a spectrophotometer is used as the transmittance of the filter. This wavelength range of this condition (3) is also a range defined so as to discriminate the first color of the present invention (G color or the like) from the second color (R, B color, etc.), and is a range where the transmittance of the filter with a color having a relatively higher contribution ratio than the R color and the B color have is higher than the transmittances of the R and B filters. Accordingly, a filter having a relatively high transmittance at a wavelength within the range from 500 nm to 560 nm can be used as the first filter, and filters having relatively low transmittances can be used as the second filters.

[Condition (4)]

The condition (4) is that filters having at least two colors that are a color (e.g., G color among RGB) most contributing to the luminance signal among the three primary colors and a color different from the three primary colors are used as first filters. In this case, a filter corresponding to a color other than the colors of the first filters is adopted as the second filter.

<Transparent Filter (W Filter)>

In the foregoing embodiments, the color filters that include color filters corresponding mainly to RGB are described. Some of these color filters may be transparent filters (W filters corresponding to white pixels). In particular, it is preferable that W filters be arranged instead of some of the first filters (G filters). Such replacement of some of the G pixels with the white pixels can suppress degradation of the color reproducibility even if the pixel size is fined.

The W filter is a transparent color (first color) filter. The W filter allows light corresponding to a wavelength range of visible light to pass and, for instance, is a filter whose transmittances of light with RGB colors are at least 50%. The W filter has a transmittance higher than the G filter does. Accordingly, the contribution ratio for acquiring the luminance signal is higher than the ratio of G color (60%), and satisfies the foregoing condition (1).

Figure 21:
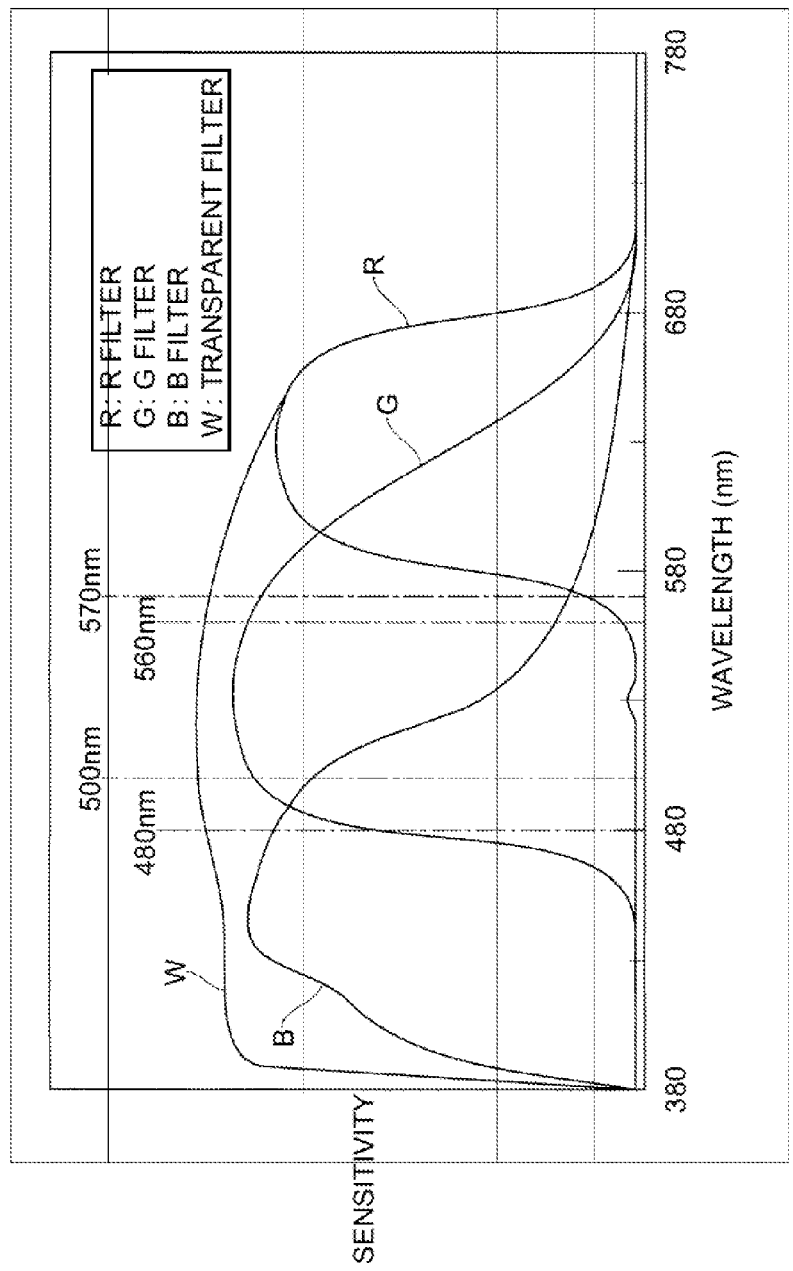
FIG. 21 is a graph showing an example of spectral sensitivity characteristics of photodiodes on which R filters, G filters, B filters and transparent filters are arranged.

FIG. 21 is a graph showing an example of spectral sensitivity characteristics of photodiodes on which R filters, G filters, B filters and transparent filters are arranged.

In FIG. 21 showing the spectral sensitivity characteristics of the color filter array (light receiving element), the peak of the transmittance of the W filter (the peak of sensitivity of white pixel) is within a range from 480 nm to 570 nm. The transmittance of the W filter is higher than the transmittances of the R and B filters at a wavelength within a range from 500 nm to 560 nm. Thus, the W filter also satisfies the foregoing conditions (2) and (3). Note that as with the W filter, the G filter also satisfies the foregoing conditions (1) to (3).

Since the W filter thus satisfies the foregoing conditions (1) to (3), the W filter can be adopted as the first filter of the present invention. In the color filter array, some of the G filters corresponding to a G color most contributing to the luminance signal among three RGB primary colors are thus replaced with the W filters. Accordingly, this array also satisfies the foregoing condition (4).

<Multiple Types of First Filter (G Filter)>

The G filter with the G color as the first filter is not limited to one type. For instance, multiple types of G filters can be adopted as the first filters. That is, the G filters of the color filters (basic array pattern) according to the foregoing embodiments may be appropriately replaced with G1 filters and G2 filters.

Figure 22:
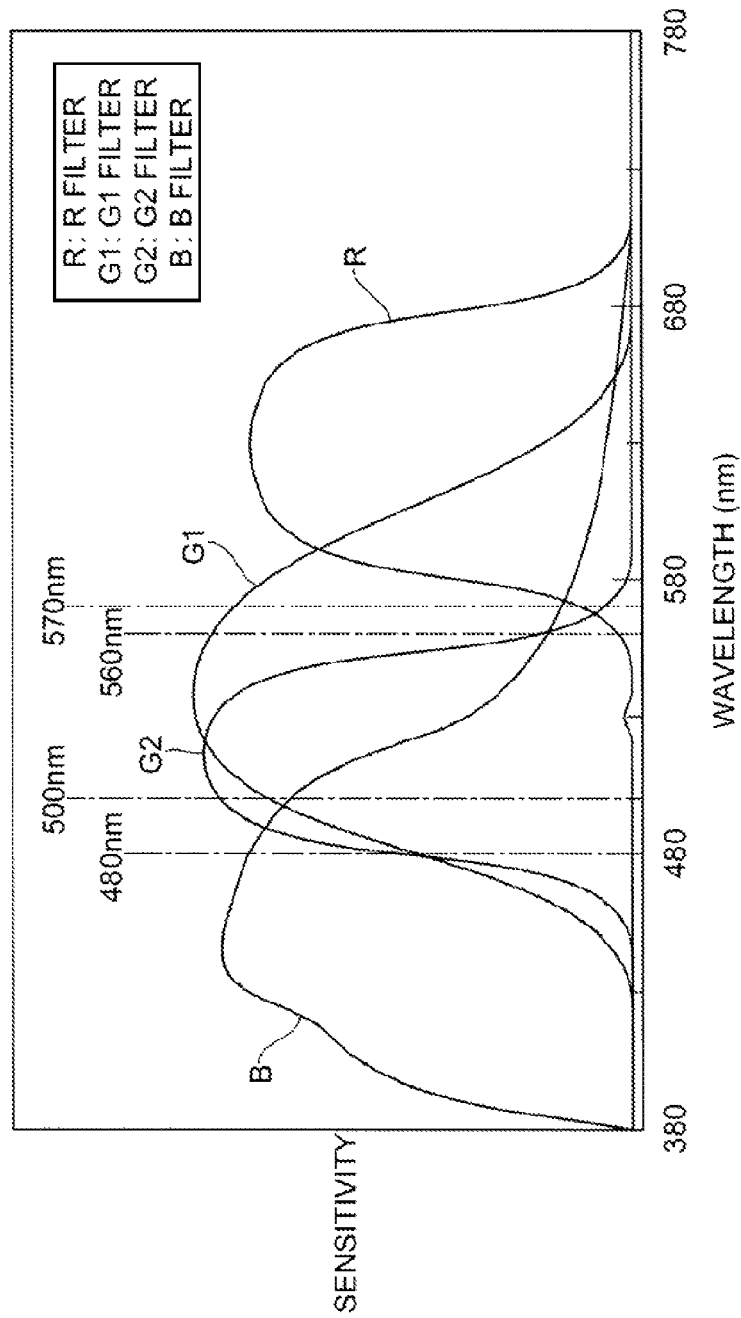
FIG. 22 is a graph showing an example of spectral sensitivity characteristics of photodiodes on which R filters, G1 filters, G2 filters and B filters are arranged.

FIG. 22 is a graph showing an example of spectral sensitivity characteristics of photodiodes on which R filters, G1 filters, G2 filters and B filters are arranged. The G1 filter allows G light in a first wavelength band to pass. The G2 filter allows G light in a second wavelength band highly correlated with that of the G1 filter to pass.

The existing G filter (e.g. the G filter in the first embodiment) can be adopted as the G1 filter. A filter highly correlated with the G1 filter can be adopted as the G2 filter. In this case, it is preferable that the peak value of the spectral sensitivity curve of the light receiving element on which the G2 filters be arranged, for instance, at a wavelength within a range from 500 nm to 535 nm (around the peak value of the spectral sensitivity curve of the light receiving element on which the existing G filters are arranged). Note that, for instance, the method described in Japanese Patent Application Laid-Open No. 2003-284084 is used as the method of defining the color filters with the four colors (R, G1, G2 and B).

The colors of the image acquired by the color image pickup element are thus configured to be four types, and color information to be acquired is increased, thereby allowing colors to be represented more correctly in comparison with the case of acquiring only three types of colors (RGB). That is, colors look different through the eye can be reproduced as different colors, and colors look the same can be reproduced as the same colors (improvement in "color discriminability").

The transmittances of the G1 and G2 filters are basically the same as the transmittance of the G filter of the first embodiment. Accordingly, the contribution ratio for acquiring the luminance signal becomes higher than 50%. The G1 and G2 filters thus satisfy the foregoing condition (1).

In FIG. 22 showing the spectral sensitivity characteristics of the color filter array (light receiving element), the peaks of the transmittances of the G1 and G2 filters (the peaks of sensitivities of the G pixels) is at a wavelength within a range from 480 nm to 570 nm. The transmittances of the G1 and G2 filters are higher than the transmittances of the R and B filters at a wavelength within a range from 500 nm to 560 nm. Thus the G1 and G2 filters also satisfy the foregoing conditions (2) and (3).

Note that the arrangements and the numbers of G1 and G2 filters may be appropriately changed. The number of types of G filters may be three or more.

<Emerald Filter (E Filter)>

The foregoing embodiments describe the color filters that mainly include color filters having colors corresponding to RGB colors. Alternatively, some of the filters having these colors may be replaced with filters with other colors. For instance, filters (E filters corresponding to E pixels) corresponding to an emerald (E) color may be adopted. In particular, it is preferable that E filters be arranged instead of some of the first filters (G filters). Such use of the color filter array with four colors where some of the G filters are replaced with the E filters can improve the reproducibility of a high range component of luminance, reduce jagginess, and improve a sense of resolution.

Figure 23:
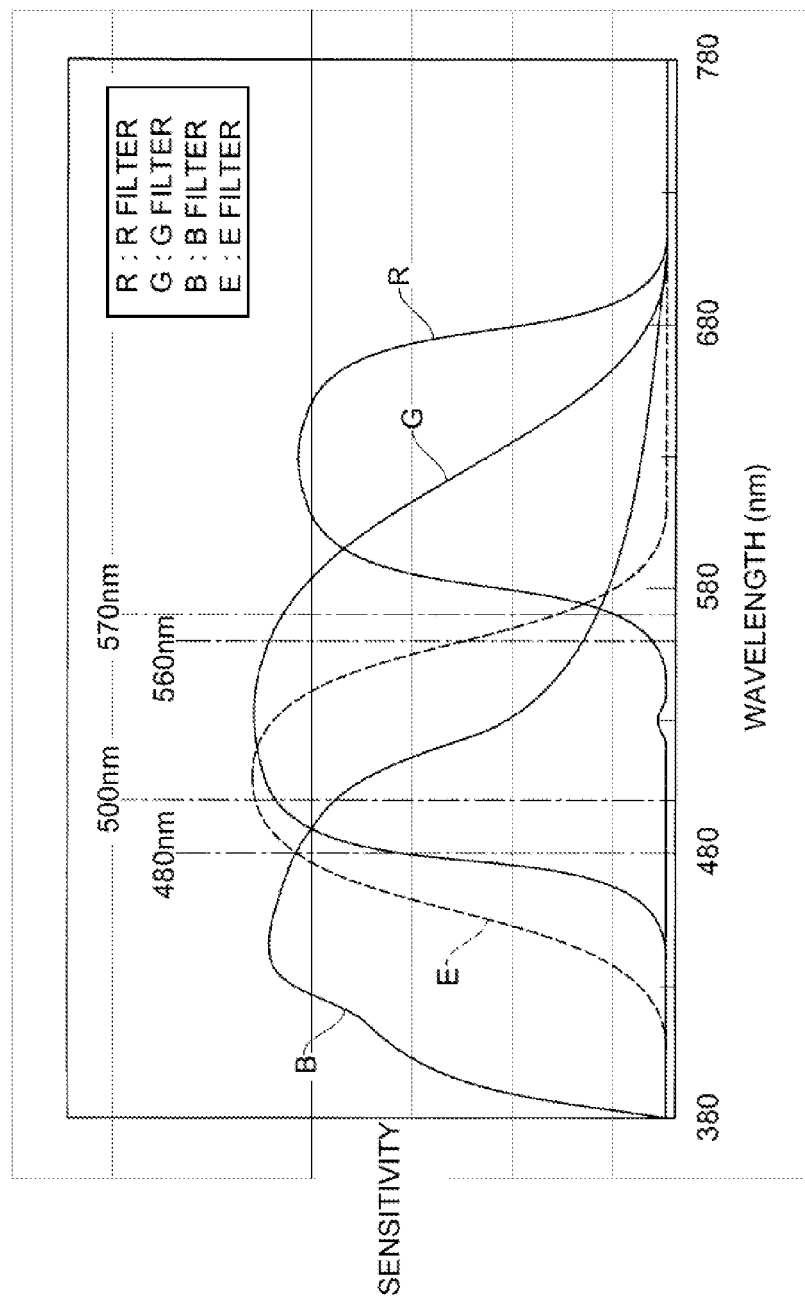
FIG. 23 is a graph showing an example of spectral sensitivity characteristics of photodiodes on which R filters, G filters, B filters and E filters are arranged.

FIG. 23 is a graph showing an example of spectral sensitivity characteristics of photodiodes on which R filters, G filters, B filters and E filters are arranged.

In FIG. 23 showing the spectral sensitivity characteristics of the color filter array (light receiving element), the peak of the transmittance of the E filter (the peak of sensitivity of E pixel) is within a range from 480 nm to 570 nm. The transmittance of the E filter is higher than the transmittances of the R and B filters at a wavelength within a range from 500 nm to 560 nm. Thus, the E filter also satisfies the foregoing conditions (2) and (3). In the color filter array, some of the G filters corresponding to a G color most contributing to the luminance signal among three RGB primary colors are thus replaced with the E filters. Accordingly, this array also satisfies the foregoing condition (4).

According to the spectral characteristics shown in FIG. 23, the E filter has a peak nearer to the short wavelength side than the G filter does. Alternatively, in some cases, the E filter has a peak nearer to the long wavelength side than the G filter does (looking a color nearer to yellow). Thus, a filter that satisfies each condition of the present invention can be selected as the E filter. For instance, the emerald filter E that satisfies the condition (1) can be selected.

<Other Color Types>

Each of the foregoing embodiments describes the color filter arrangement that includes primary color RGB color filters. Alternatively, for instance, the present invention can be applied to a four-complementary-color filter arrangement where G is added to complementary colors of the primary RGB colors, i.e., C (cyan), M (magenta) and Y (yellow). Also in this case, a filter satisfying any of the conditions (1) to (4) is adopted as the first filter of the present invention, and a filter with another color is adopted as the second color filter.

If an image pickup element where the entire or some of the G filters that are the first filters are replaced with the W filters, G2 filters or E filters are used at the positions of the first filters, the phase difference pixels may be arranged at the positions where the W filters, G2 filters or E filters are arranged.

For instance, adoption of the W filters as the filters where the phase difference pixels are arranged enables the phase difference pixels to have high sensitivity.

Another embodiment of the imaging device 10 may be, for instance, a mobile phone having a camera function, a smartphone, a PDA (Personal Digital Assistants) or a mobile game machine. Hereinafter, a smartphone is exemplified, and described in detail with reference to the drawings.

<Configuration of Smartphone>

Figure 24:
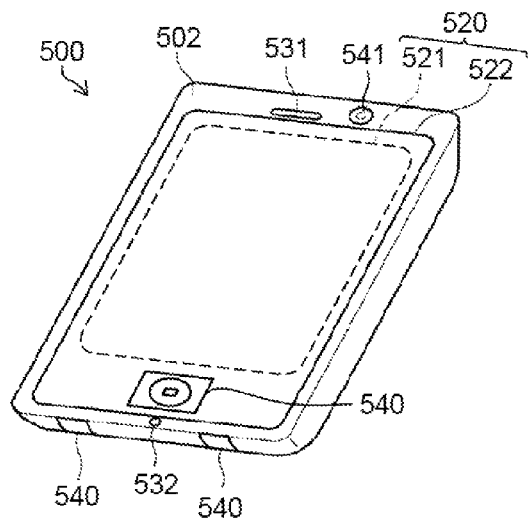
FIG. 24 is an appearance diagram of a smartphone that is another embodiment of an imaging device.

FIG. 24 shows an appearance of a smartphone 500 that is another embodiment of the imaging device 10. The smartphone 500 shown in FIG. 24 has a flat-shaped casing 502, and includes a display input unit 520 in which a display panel 521 as a display unit and an operation panel 522 as an input unit are integrated on one surface of the casing 502. Furthermore, the casing 502 includes a speaker 531, a microphone 532, an operation unit 540, and a camera unit 541. Note that the configuration of the casing 502 is not limited thereto. Alternatively, for instance, a configuration where the display unit and the input unit are independent from each other may be adopted, or a configuration that has a folding structure or a sliding mechanism may be adopted.

Figure 25:
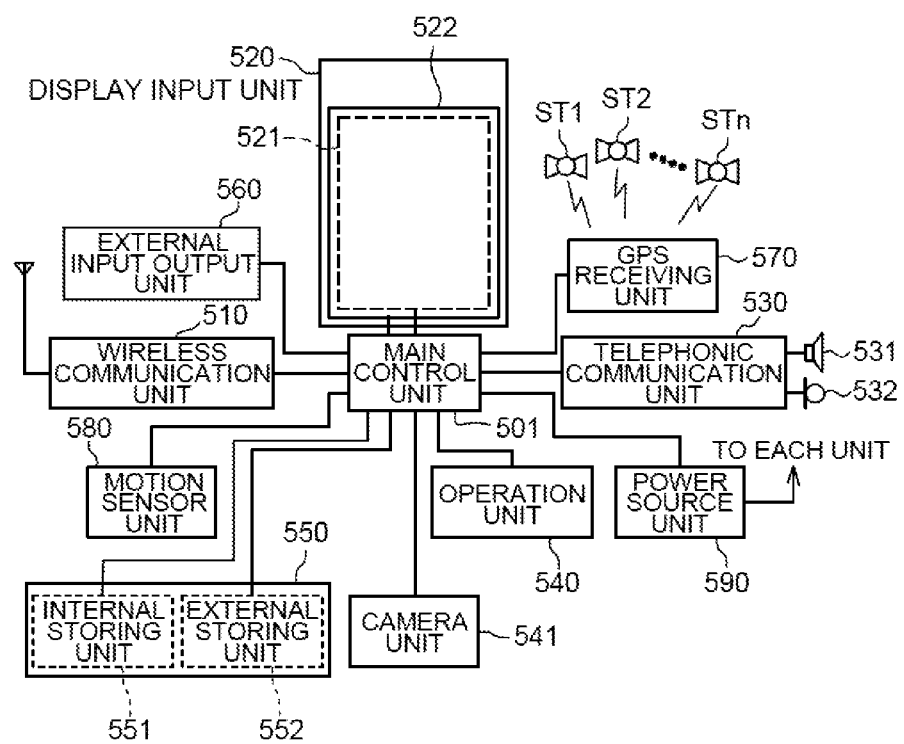
FIG. 25 is a block diagram showing a configuration of a main part of the smartphone.

FIG. 25 is a block diagram showing a configuration of the smartphone 500 shown in FIG. 24. As shown in FIG. 25, the smartphone includes main configuration elements, which are a wireless communication unit 510, a display input unit 520, a telephonic communication unit 530, the operation unit 540, the camera unit 541, a storing unit 550, an external input/output unit 560, a GPS (Global Positioning System) receiving unit 570, a motion sensor unit 580, a power source unit 590, and a main control unit 501. Furthermore, the smartphone 500 has a main function that is a wireless communication function of performing mobile wireless communication via a base station apparatus BS and a mobile communication network NW.

The wireless communication unit 510 performs wireless communication to the base station apparatus BS accommodated in the mobile communication network NW according to instructions from the main control unit 501. Through use of the wireless communication, various types of file data, such as audio data and image data, and email data and the like are transmitted and received, and web data and streaming data are received.

The display input unit 520 is what is called a touch panel that is controlled by the main control unit 501 to display images (still images and moving images) and character information and the like and visually transmit information to the user, and detect a user operation that is made in response to the displayed information, and includes the display panel 521 and the operation panel 522. Preferably, for viewing the generated 3D images, the display panel 521 is a 3D display panel.

The display panel 521 is a LCD (Liquid Crystal Display), an OELD (Organic Electro-Luminescence Display) or the like that is used as a display device. The operation panel 522 is a device that is disposed on a display screen of the display panel 521 in a manner allowing a displayed image to be viewed, and operated by a finger of the user or a stylus and detects one or multiple coordinates. When the device is operated by the finger of the user or the stylus, a detection signal generated by the operation is output to the main control unit 501. Next, the main control unit 501 detects an operation position (coordinates) on the display panel 521 on the basis of the received detection signal.

As shown in FIG. 24, the display panel 521 and the operation panel 522 of the smartphone 500 are integrated to configure the display input unit 520, and are arranged such that the operation panel 522 completely covers the display panel 521. In the case of adopting this arrangement, the operation panel 522 may has a function of detecting a user operation also in a region out of the display panel 521. In other words, the operation panel 522 may include a detection area for an overlap portion overlapping with the display panel 521 (hereinafter, referred to as a display region) and another detection area for a peripheral portion that does not overlap with the display panel 521 (hereinafter, referred to as non-display region).

The size of the display area and the size of the display panel 521 may be completely matched with each other. Alternatively, it is not necessarily to match both areas. Furthermore, the operation panel 522 may include two sensing areas that are a peripheral portion and an inner portion other than the peripheral portion. Moreover, the width of the peripheral portion is appropriately designed according to the size of the casing 502. Furthermore, a position detection scheme adopted in the operation panel 522 may be any of a matrix switch scheme, a resistance film scheme, a surface acoustic wave scheme, an infrared scheme, an electromagnetic induction scheme, a capacitance scheme and the like. Any of these schemes may be adopted.

The telephonic communication unit 530, which includes the speaker 531 and the microphone 532, converts an audio of the user input via the microphone 532 into audio data that can be processed in the main control unit 501 and outputs the data to the main control unit 501, and decodes the audio data received by the wireless communication unit 510 or the external input/output unit 560 and outputs the data from the speaker 531. As shown in FIG. 24, for instance, the speaker 531 can be mounted on the same surface as the surface on which the display input unit 520 is arranged. The microphone 532 can be mounted on the side surface of the casing 502.

The operation unit 540 is hardware keys using key switches and the like, and receives an instruction from the user. For instance, as shown in FIG. 24, the operation unit 540 is mounted below or on a lower side of the display unit on the casing 502 of the smartphone 500. This operation unit is a press button switch that is turned on by being depressed by a finger or the like, and turned off by the resilience of a spring or the like when the finger is removed.

The storing unit 550 stores a control program and control data for the main control unit 501, address data associated with the names and phone numbers of communication opposite parties, data on transmitted and received email, web data downloaded through web browsing, and downloaded content data, and temporarily stores streaming data. The storing unit 550 includes an internal storing unit 551 embedded in the smartphone, and an external storing unit 552 having a detachable external memory slot. Note that the internal storing unit 551 and the external storing unit 552, which configure the storing unit 550, are achieved using any of storing media, such as a flash memory type, hard disk type, multimedia card micro type, and card type memories (e.g. Micro SD (R) memory etc.), a RAM (Random Access Memory), and a ROM (Read Only Memory).

The external input/output unit 560 serves as an interface with all external devices connected to the smartphone 500, and is for direct or indirect connection to an external device via communication or the like (e.g., Universal Serial Bus (USB), IEEE1394, etc.) or a network (e.g., the Internet, wireless LAN, Bluetooth (R), RFID (Radio Frequency Identification), infrared communication (Infrared Data Association: IrDA) (R), UWB (Ultra Wideband) (R), ZigBee (R), etc.).

The external devices connected to the smartphone 500 are, for instance, wired and wireless headsets, wired and wireless external chargers, wired and wireless data ports, a memory card connected via a card socket, SIM (Subscriber Identity Module Card)/UIM (User Identity Module Card) card, an external audio video device connected via an audio video I/O (Input/Output) terminal, a wirelessly connected external audio video device, smartphones connected in wired and wireless manners, personal computers connected in wired and wireless manners, PDAs connected in wired and wireless manners, and personal computers and earphones connected in wired and wireless manners. The external input and output unit can transmits data sent from such an external device, to each configuration element in the smartphone 500, and allows data in the smartphone 500 to be transmitted to the external device.

The GPS receiving unit 570 receives GPS signals transmitted from GPS satellites ST1 to STn, according to an instruction by the main control unit 501, executes a positioning operation process based on the received GPS signals, and detects the position of the smartphone 500 that includes the latitude, longitude and altitude. When position information can be acquired from the wireless communication unit 510 or the external input/output unit 560 (e.g. a wireless LAN), the GPS receiving unit 570 can detect the position using the position information.

The motion sensor unit 580 includes, for instance, three-axis acceleration sensor and the like, and detects physical movement of the smartphone 500 according to the instruction by the main control unit 501. Through detection of the physical movement of the smartphone 500, the movement direction and acceleration of the smartphone 500 are detected. The detection result is output to the main control unit 501.

The power source unit 590 supplies power stored in a battery (not shown) to each unit of the smartphone 500 according to the instruction by the main control unit 501.

The main control unit 501 includes a microprocessor, operates according to a control program and control data stored in the storing unit 550, and integrally controls each unit of the smartphone 500. The main control unit 501 has a mobile communication function of controlling each unit of the communication system and an application processing function for performing audio communication and data communication via the wireless communication unit 510.

The application processing function can be achieved by the main control unit 501 operating according to application software stored in the storing unit 550. The application processing function is, for instance, an infrared communication function of controlling the external input/output unit 560 to perform data communication with an opposite device, an email function of transmitting and receiving email, a web browsing function of browsing web pages, and a function of generating 2D images and 3D images according to the present invention.

The main control unit 501 has an image processing function of displaying images and the like on the display input unit 520 on the basis of image data (still image and moving image data), such as received data and downloaded streaming data. The image processing function is a function of the main control unit 501 decoding the image data, applying an image processing to the decoding result, and displaying the image on the display input unit 520.

Furthermore, the main control unit 501 executes display control for the display panel 521, and operation detection control that detects user operations via the operation unit 540 and the operation panel 522.

According to execution of the display control, the main control unit 501 displays software keys, such as an icon for activating application software, and scrollbars, and further displays a window for creating email. Note that the scrollbars are software keys for accepting instructions for moving a displayed part of an image that is large and cannot be accommodated in a display region on the display panel 521.

Through execution of the operation detection control, the main control unit 501 detects a user operation via the operation unit 540, accepts an operation to the icon and an input of a character string into an input field in the window via the operation panel 522, and accepts a request of scrolling the displayed image via the scrollbars.

Furthermore, the main control unit 501 has a touch panel control function of determining whether the operation position on the operation panel 522 is in the overlap portion (display area) overlapping with the display panel 521 or the other peripheral portion that does not overlap with the display panel 521 (non-display area) and of controlling the sensing region of the operation panel 522 and the display position of the software keys.

The main control unit 501 can detect a gesture operation on the operation panel 522, and execute a preset function in response to the detected gesture operation. The gesture operation is not a conventional simple touch operation, but means drawing a trajectory by a finger, simultaneously designating multiple points, and drawing a trajectory from at least one of the multiple positions through combination of these operations.

The camera unit 541 is a digital camera that electronically takes an image using an image pickup element, such as a CMOS (Complementary Metal Oxide Semiconductor) or a CCD (Charge-Coupled Device), and has a function equivalent to the function shown in the block diagram of FIG. 3. Here, the color filter array of the image pickup element of the camera unit 541, the array of the phase difference pixels and the like may be an embodiment analogous to that of the imaging device 10. Image processing and control processes with such a color filter array (thinning-reading, phase difference detection, focus adjustment, etc.) can be performed in a manner analogous to that described above on the imaging device 10. The camera unit 541 converts image data acquired by imaging into, for instance, compressed image data, such as JPEG (Joint Photographic coding Experts Group), records the data in the storing unit 550, and outputs the data via the external input/output unit 560 and the wireless communication unit 510, through control by the main control unit 501. In the smartphone 500 shown in FIG. 24, the camera unit 541 is mounted on the same surface as that of the display input unit 520. However, the mount position of the camera unit 541 is not limited thereto. Alternatively, this unit may be mounted on the back of the display input unit 520, or multiple camera units 541 may be mounted. In the case where multiple camera units 541 are mounted, a camera unit 541 used for imaging may be switched to solely take an image, or the multiple camera units 541 may be simultaneously used for taking images.

The camera unit 541 can be used for various functions of the smartphone 500. For instance, an image acquired by the camera unit 541 can be displayed on the display panel 521. As one of input operations on the operation panel 522, an image from the camera unit 541 can be used. When the GPS receiving unit 570 detects the position, the image from the camera unit 541 may be referred to and the position may be detected. Furthermore, the image from the camera unit 541 can be referred to, and the optical axis direction of the camera unit 541 of the smartphone 500 can be detected without use of a three-axis acceleration sensor or together with use of the three-axis acceleration sensor, and the current usage environment can be detected. It is a matter of course that the image from the camera unit 541 can be used in the application software.

The smartphone 500 having the foregoing configuration can accurately perform phase difference AF during moving image taking in a manner analogous to that of the imaging device 10, and prevent or alleviate reduction in image quality of the image taken through the phase difference pixels.

[Others]

In the embodiments of the present invention, pixel signals are directly thinning-read from the image pickup element according to the thinning pattern during moving image taking. However, the embodiments are not limited thereto. Alternatively, an image on all pixels may be read from the image pickup element, pixel signals may be extracted from the read image according to the thinning pattern, and a color image according to a prescribed color array including the phase difference pixels may be acquired. Also in this case, the image size of a target image of signal processing including simultaneous processing can be reduced. Accordingly, reduction in time of processing a moving image can be facilitated. Note that, as to the method of extracting pixel signals according to the thinning pattern, the pixel signal according to the thinning pattern may be extracted by a pixel mixing process that adds or mixes the output signals from multiple surrounding pixels having the same color. In particular, by performing the pixel mixing process in the image pickup element immediately after reading, the time of processing the moving image can be further reduced.

The color filter array of the image pickup element adopted in the present invention is not limited to the arrays shown in FIG. 4 and FIG. 17. Alternatively, for instance, in the color filter array, only the 3×3-pixel A array or B array in the basic array pattern shown in FIG. 4 and FIG. 17 may be repeatedly arranged in the vertical direction and the vertical direction. That is, the color filter may have the basic array pattern having repeatedly arranged M×N pixels (M, N: integers at least three), at least one first filter corresponding to the first color (the G filter, W filter, G1 filter, G2 filter, or E filter in this embodiment) and at least one second color (the R filter or B filter in this embodiment) are arranged in each line in the first direction and the second direction in the basic array pattern. Note that the size (M×N pixels) of the basic array pattern may conform to the array pattern corresponding to another number of pixels. Although increase in the number of pixels of the basic array pattern complicates signal processing including simultaneous processing, increase in size of the basic array pattern cannot exert specific advantageous effects. Accordingly, in view of preventing the signal processing from being complicated, it is preferable that the size of the basic array pattern be 10×10 pixels or less, which is not too large. It is further preferable that the minimum basic array pattern be 3×3 pixels. Furthermore, the filters corresponding to the second colors may include a filter having a color other than the colors of R filter and the B filter.

In this embodiment, one of the first phase difference pixel p1 and the second phase difference pixel p2 is arranged in each 3×3-pixel A array or B array in the 6×6-pixel basic array pattern. Accordingly, lines having the phase difference pixels are arranged at a period corresponding to the size of the A array or B array (arrangement of one line for every three lines). However, periodical arrangement of phase difference pixels is not limited to that in this embodiment. For instance, according to arrangement where one of the first phase difference pixel and the second phase difference image is in the basic array pattern, the lines having phase difference pixels are arranged at a period corresponding to the size of the basic array pattern.

Furthermore, the present invention can be applied to image pickup elements that include complementary color filters having complementary colors of the primary colors RGB, i.e., C (cyan), M (magenta) and Y (yellow), or a color filter array including the complementary color filters and color filters having another color added thereto.

Moreover, the arrangement positions of the phase difference pixels are not limited to the embodiments. It is sufficient that the positions are only arranged on lines to be thinning-read during moving image taking.

The image pickup element applied to the present invention is not limited to the element where multiple pixels and color filters are arranged into a square lattice in the horizontal direction and the vertical direction as shown in FIG. 4 and the like. Alternatively, the element may have an oblique lattice array (more specifically, an array acquired by turning the color filter array shown in FIG. 4 etc. by 45°). In this case, the basic array pattern also has an oblique lattice array pattern.

It is a matter of course that the present invention is not limited to the foregoing embodiments, and various modifications may be made in a scope without departing from the spirit of the present invention.

What is claimed is:

1. An imaging device, comprising:
an imaging lens;
an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed;
a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image;
a moving image generating device which generates moving image data, based on the thinned color image;
a phase difference detection device which detects a phase difference between output signals that correspond to the first and second phase difference pixels included in the thinned color image, based on each output signal; and
a focus adjustment device which adjusts a focus position of the imaging lens based on the phase difference detected by the phase difference detection device,
wherein the prescribed color filter array includes first filters corresponding to at least one first color, and second filters corresponding to at least two second colors having lower contribution ratios for acquiring luminance signals than the first color has, and has a basic array pattern according to which the first filters and the second filters are arranged, the basic array pattern being repeatedly arranged in the first direction and the second direction,
at least one of each of the first filters and the second filters corresponding to the respective second colors is arranged on each of pixel lines in the first direction and the second direction in the basic array pattern, and
the first and second phase difference pixels are arranged at positions of the filters having the same color on pixel lines in the first direction, on the thinning pattern in the focal point detection area of the image pickup element, wherein
in the thinned color image, pixels having a color identical to a color of pixels at positions of the first and second phase difference pixels are arranged, in at least one of the first and second directions, adjacent to the first and second phase difference pixels,
the device further comprises an interpolating calculation device which calculates pixel values of the pixels at the positions of the first and second phase difference pixels in the thinned color image by interpolating pixel values of surrounding pixels including pixels having a same color adjacent to the first and the second phase difference pixels, and
the moving image generating device generates the moving image data based on a color image using values calculated by the interpolating calculation device as pixel values of pixels at positions of the first and second phase difference pixels in the thinned color image.

2. The imaging device according to claim 1, wherein in the tinned color image, the pixels having the first color are consecutively arranged in the second direction, and the pixels having the colors of the second colors are arranged in the second direction.

3. The imaging device according to claim 1, wherein in the tinned color image, the pixels having the first color are consecutively arranged in the second direction, and the pixels having the colors of the second colors are alternately arranged in the second direction.

4. The imaging device according to claim 1,
wherein a ratio of the number of all pixels having the first color corresponding to the first filters is greater than ratios of the numbers of pixels of the respective second colors corresponding to the second filters, and
the first and the second phase difference pixels are arranged on positions of the first filters.

5. The imaging device according to claim 1,
wherein the first filters are arranged in M×N pixels (M, N: integers equal to or greater than three), and the M×N pixels are repeatedly arranged in the first and second directions.

6. The imaging device according to claim 5,
wherein one or two phase difference pixels that are one of the first and the second phase difference pixels are arranged in the M×N pixels.

7. The imaging device according to claim 5,
wherein the first and the second phase difference pixels are arranged such that the first and second phase difference pixels are arranged as a pair in the second direction.

8. The imaging device according to claim 6,
wherein the first and second phase difference pixels are alternately arranged on one pixel line in the first direction.

9. The imaging device according to claim 1,
wherein the second colors are two colors that are a first component color and a second component color,
the basic array pattern is configured such that a first sub-array and a second sub-array are alternately arranged in the first direction and the second direction,
in the first sub-array and the second sub-array, the second filters are arranged at same positions, and positions of the second filters corresponding to the first component color in the first sub-array correspond to positions of the second filters corresponding to the second component color in the second sub-array, and
positions of the second filters corresponding to the second component color in the first sub-array correspond to positions of the second filters corresponding to the first component color in the second sub-array.

10. The imaging device according to claim 9,
wherein the first and the second phase difference pixels are arranged at the positions of the first filters in at least one sub-array of the first sub-array and the second sub-array.

11. The imaging device according to claim 9,
wherein in at least one direction between the first direction and the second direction, the first or the second phase difference pixel is arranged at a period of a pixel size of each of sub-arrays that are the first sub-array and the second sub-array.

12. The imaging device according to claim 1,
wherein the first color is a green (G) color, and the second colors are a red (R) color and a blue (B) color,
the color filters include R filters, G filters and B filters corresponding to the R, G and B colors, respectively,
the basic array pattern is configured such that a first sub-array and a second sub-array are alternately arranged in the first direction and the second direction,
in the first sub-array, the G filters are arranged at a center and four corners of 3×3 pixels, and the B filters are arranged upper and lower and the R filters are arranged left and right, sandwiching the G filter at the center,
in the second sub-array, the G filters are arranged at a center and four corners of 3×3 pixels, and the R filters are arranged upper and lower and the B filters are arranged left and right, sandwiching the G filter at the center, and
one pixel of the pixels having the G filters in the first and second sub-arrays is configured as one phase difference pixel between the first and second phase difference pixels.

13. The imaging device according to claim 1,
wherein the first color is a green (G) color, the second colors are a red (R) color and a blue (B) color,
the color filters include R filters, G filters and B filters corresponding to the R, G and B colors, respectively,
the basic array pattern is configured such that a first sub-array and a second sub-array are alternately arranged in the first direction and the second direction,
in the first sub-array, the R filter is arranged at a center of 3×3 pixels, the B filters are arranged at four corners, and the G filters are arranged upper, lower, left and right, sandwiching the R filter at the center,
in the second sub-array, the B filter is arranged at a center of 3×3 pixels, the R filters are arranged at four corners, and the G filters are arranged upper, lower, left and right, sandwiching the B filter at the center, and
one pixel of the pixels having the G filters in the first and second sub-arrays is configured as one phase difference pixel between the first and second phase difference pixels.

14. The imaging device according to claim 12,
wherein pixels having transparent filters are used instead of the pixels that are configured as the first and second phase difference pixels and have the G filters.

15. The imaging device according to claim 1,
wherein the device further comprises a recording device which records the moving image generated by the moving image generating device.

16. The imaging device according to claim 1, wherein the thinned color image has all pixels on the pixel lines in the first direction.

17. The imaging device according to claim 16, wherein, in the thinned color image, pixels having a color identical to a color of pixels at positions of the first and second phase difference pixels are arranged, in the first directions, adjacent to the first and second phase difference pixels.

18. An imaging device, comprising:
an imaging lens;
an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed;
a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image;
a moving image generating device which generates moving image data, based on the thinned color image;
a phase difference detection device which detects a phase difference between output signals that correspond to the first and second phase difference pixels included in the thinned color image, based on each output signal; and
a focus adjustment device which adjusts a focus position of the imaging lens based on the phase difference detected by the phase difference detection device, wherein the prescribed color filter array includes first filters corresponding to at least one first color having a peak of transmittance within a wavelength range from 480 nm to 570 nm, and second filters corresponding to at least two second colors having peaks of transmittance out of the range, and has a basic array pattern according to which the first filters and the second filters are arranged, the basic array pattern being repeatedly arranged in the first direction and the second direction, at least one of each of the first filters and the second filters corresponding to the respective second colors is arranged on each of pixel lines in the first direction and the second direction in the basic array pattern, and the first and second phase difference pixels are arranged at positions of the filters having the same color on pixel lines in the first direction, on the thinning pattern in the focal point detection area of the image pickup element, wherein in the thinned color image, pixels having a color identical to a color of pixels at positions of the first and second phase difference pixels are arranged, in at least one of the first and second directions, adjacent to the first and second phase difference pixels, the device further comprises an interpolating calculation device which calculates pixel values of the pixels at the positions of the first and second phase difference pixels in the thinned color image by interpolating pixel values of surrounding pixels including pixels having a same color adjacent to the first and the second phase difference pixels, and the moving image generating device generates the moving image data based on a color image using values calculated by the interpolating calculation device as pixel values of pixels at positions of the first and second phase difference pixels in the thinned color image.

19. An imaging device, comprising:

an imaging lens;

an image pickup element in which includes color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed;

a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image;

a moving image generating device which generates moving image data, based on the thinned color image;

a phase difference detection device which detects a phase difference between output signals that correspond to the first and second phase difference pixels included in the thinned color image, based on each output signal; and a focus adjustment device which adjusts a focus position of the imaging lens based on the phase difference detected by the phase difference detection device, wherein the prescribed color filter array includes first filters corresponding to at least one first color, and second filters corresponding to at least two second colors having lower transmittances than the first filters within a wavelength range from 500 nm to 560 nm, and has a basic array pattern according to which the first filters and the second filters are arranged, the basic array pattern being repeatedly arranged in the first direction and the second direction, and at least one of each of the first filters and the second filters corresponding to the respective second colors is arranged on each of pixel lines in the first direction and the second direction in the basic array pattern, and the first and second phase difference pixels are arranged at positions of the filters having the same color on pixel lines in the first direction, on the thinning pattern in the focal point detection area of the image pickup element, wherein in the thinned color image, pixels having a color identical to a color of pixels at positions of the first and second phase difference pixels are arranged, in at least one of the first and second directions, adjacent to the first and second phase difference pixels, the device further comprises an interpolating calculation device which calculates pixel values of the pixels at the positions of the first and second phase difference pixels in the thinned color image by interpolating pixel values of surrounding pixels including pixels having a same color adjacent to the first and the second phase difference pixels, and the moving image generating device generates the moving image data based on a color image using values calculated by the interpolating calculation device as pixel values of pixels at positions of the first and second phase difference pixels in the thinned color image.

20. An imaging device, comprising:

an imaging lens;

an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed;

a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image;

a moving image generating device which generates moving image data, based on the thinned color image;

a phase difference detection device which detects a phase difference between output signals that correspond to the first and second phase difference pixels included in the thinned color image, based on each output signal; and a focus adjustment device which adjusts a focus position of the imaging lens based on the phase difference detected by the phase difference detection device, wherein the prescribed color filter array includes first filters corresponding to at least two first colors that are a color most contributing to a luminance signal among three primary colors and a fourth color different from the three primary colors, and second filters corresponding to at least two second colors other than the first color, and has a basic array pattern according to which the first filters and the second filters are arranged, the basic array pattern being repeatedly arranged in the first direction and the second direction, and at least one of each of the first filters and the second filters corresponding to the respective second colors is arranged on each of pixel lines in the first direction and the second direction in the basic array pattern, and the first and second phase difference pixels are arranged at positions of the filters having the same color on pixel lines in the first direction, on the thinning pattern in the focal point detection area of the image pickup element, wherein in the thinned color image, pixels having a color identical to a color of pixels at positions of the first and second phase difference pixels are arranged, in at least one of the first and second directions, adjacent to the first and second phase difference pixels, the device further comprises an interpolating calculation device which calculates pixel values of the pixels at the positions of the first and second phase difference pixels in the thinned color image by interpolating pixel values of surrounding pixels including pixels having a same color adjacent to the first and the second phase difference pixels, and the moving image generating device generates the moving image data based on a color image using values calculated by the interpolating calculation device as pixel values of pixels at positions of the first and second phase difference pixels in the thinned color image.

21. An image processing method in an imaging device comprising an imaging lens, and an image pickup element in which color filters with a prescribed color filter array are arranged on multiple pixels made of photoelectric conversion elements arranged in a first direction and a second direction perpendicular to the first direction, the image pickup element including first and second phase difference pixels on which a subject image having passed through different first and second areas of the imaging lens is pupil-divided and image-formed, the method including:

a color image acquisition step of thinning-reading pixel signals according to a thinning pattern from the image pickup element, or extracting pixel signals according to the thinning pattern from a color image that is read from the image pickup element and corresponds to the prescribed color filter array, and acquiring a thinned color image;

a moving image generating step of generating moving image data, based on the thinned color image;

a phase difference detection step of detecting a phase difference between output signals that correspond to the first and second phase difference pixels included in the thinned color image, based on each output signal; and a focus adjustment step of adjusting a focus position of the imaging lens based on the phase difference detected by the phase difference detection step, and adjusting the focus position of the imaging lens in parallel with generation of the moving image by the moving image generating step, wherein the prescribed color filter array includes first filters corresponding to at least one first color, and second filters corresponding to at least two second colors having lower contribution ratios for acquiring luminance signals than the first color has, and has a basic array pattern according to which the first filters and the second filters are arranged, the basic array pattern being repeatedly arranged in the first direction and the second direction, at least one of each of the first filters and the second filters corresponding to the respective second colors is arranged on each of pixel lines in the first direction and the second direction in the basic array pattern, and the first and second phase difference pixels are arranged at positions of the filters having the same color on pixel lines in the first direction, on the thinning pattern in the focal point detection area of the image pickup element, wherein in the thinned color image, pixels having a color identical to a color of pixels at positions of the first and second phase difference pixels are arranged, in at least one of the first and second directions, adjacent to the first and second phase difference pixels, the method further comprises an interpolating calculation step of calculating pixel values of the pixels at the positions of the first and second phase difference pixels in the thinned color image by interpolating pixel values of surrounding pixels including pixels having a same color adjacent to the first and the second phase difference pixels, and the moving image generating step generates the moving image data based on a color image using values calculated by the interpolating calculation step as pixel values of pixels at positions of the first and second phase difference pixels in the thinned color image.

* * * * *